United States Patent [19]

Murphy et al.

[11] Patent Number: 5,168,432
[45] Date of Patent: Dec. 1, 1992

[54] ADAPTER FOR CONNECTION OF AN INTEGRATED CIRCUIT PACKAGE TO A CIRCUIT BOARD

[75] Inventors: James V. Murphy, Warwick; Michael J. Murphy, East Greenwich, both of R.I.

[73] Assignee: Advanced Interconnections Corporation, West Warwick, R.I.

[21] Appl. No.: 846,974

[22] Filed: Mar. 6, 1992

Related U.S. Application Data

[63] Continuation of Ser. No. 272,074, Nov. 16, 1988, abandoned, which is a continuation-in-part of Ser. No. 121,568, Nov. 7, 1987, abandoned.

[51] Int. Cl.$^5$ .............................................. H05K 5/02
[52] U.S. Cl. .................................. 361/421; 361/393; 361/396; 439/70
[58] Field of Search ............... 361/393, 396, 400, 401, 361/405, 413, 417, 419, 420; 436/68-73

[56] References Cited

U.S. PATENT DOCUMENTS

| | | | |
|---|---|---|---|
| 3,719,917 | 3/1973 | Fischer et al. | 339/17 CF |
| 4,169,642 | 10/1979 | Mouissie | 339/17 F |
| 4,195,193 | 3/1980 | Grabbe et al. | 174/52 |
| 4,393,581 | 7/1983 | Cherian | 29/827 |
| 4,427,249 | 1/1984 | Bright et al. | 439/68 |
| 4,513,355 | 4/1985 | Schroeder et al. | 361/403 |
| 4,621,884 | 11/1986 | Berkebile, Jr. et al. | 439/68 |
| 4,640,010 | 2/1987 | Brown | 29/832 |
| 4,645,279 | 2/1987 | Grabbe et al. | 439/68 |

FOREIGN PATENT DOCUMENTS

| | | |
|---|---|---|
| 0232837 | 8/1987 | European Pat. Off. |
| 1252769 | 10/1967 | Fed. Rep. of Germany |
| 2159337 | 6/1973 | France |
| 2271668 | 12/1975 | France |
| 0124424 | 4/1983 | France |

OTHER PUBLICATIONS

Hogan, "Insert-Molded Stamping Simplifies Manufacture of Terminal Block", Design News, vol. 41, Nov. 4, 1985, pp. 114–115.
Japan Abstracts, vol. 10, #213, Jul. 25, 1986.
Japan Abstracts, vol. 10, #186, Jun. 28, 1986.
Gresko, "Compact Low Profile VLSI IC Package", IBM Tech. Dis. Bulletin, vol. 24, #12, May 1982.

Primary Examiner—Gregory D. Thompson
Attorney, Agent, or Firm—Fish & Richardson

[57] ABSTRACT

An adapter for connection of an integrated circuit package to a circuit board, the package being of the type having solder leads, and the adapter comprising a plurality of pins for connection to the circuit board, a plurality of lead frame elements, each lead frame element connected to a pin, and each lead frame element including a connection region sized and positioned for making a solder connection to a lead of an integrated circuit package, and insulative plastic molded around the pins and lead frame elements, the molded plastic body having a shape providing a plurality of grooves that each expose a connection region of one of the lead frame elements and that serve to align the solder leads with the connector regions.

4 Claims, 23 Drawing Sheets

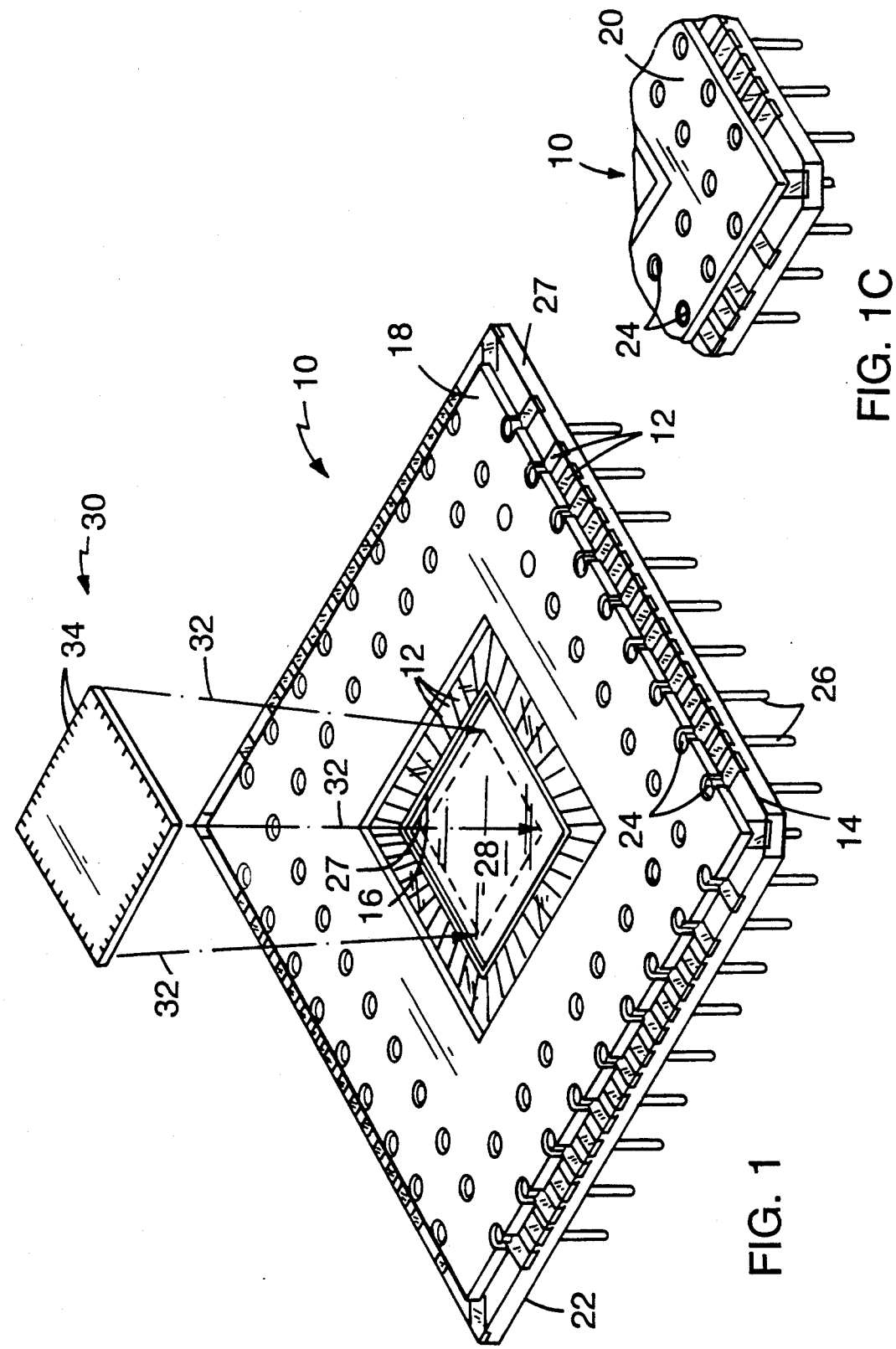

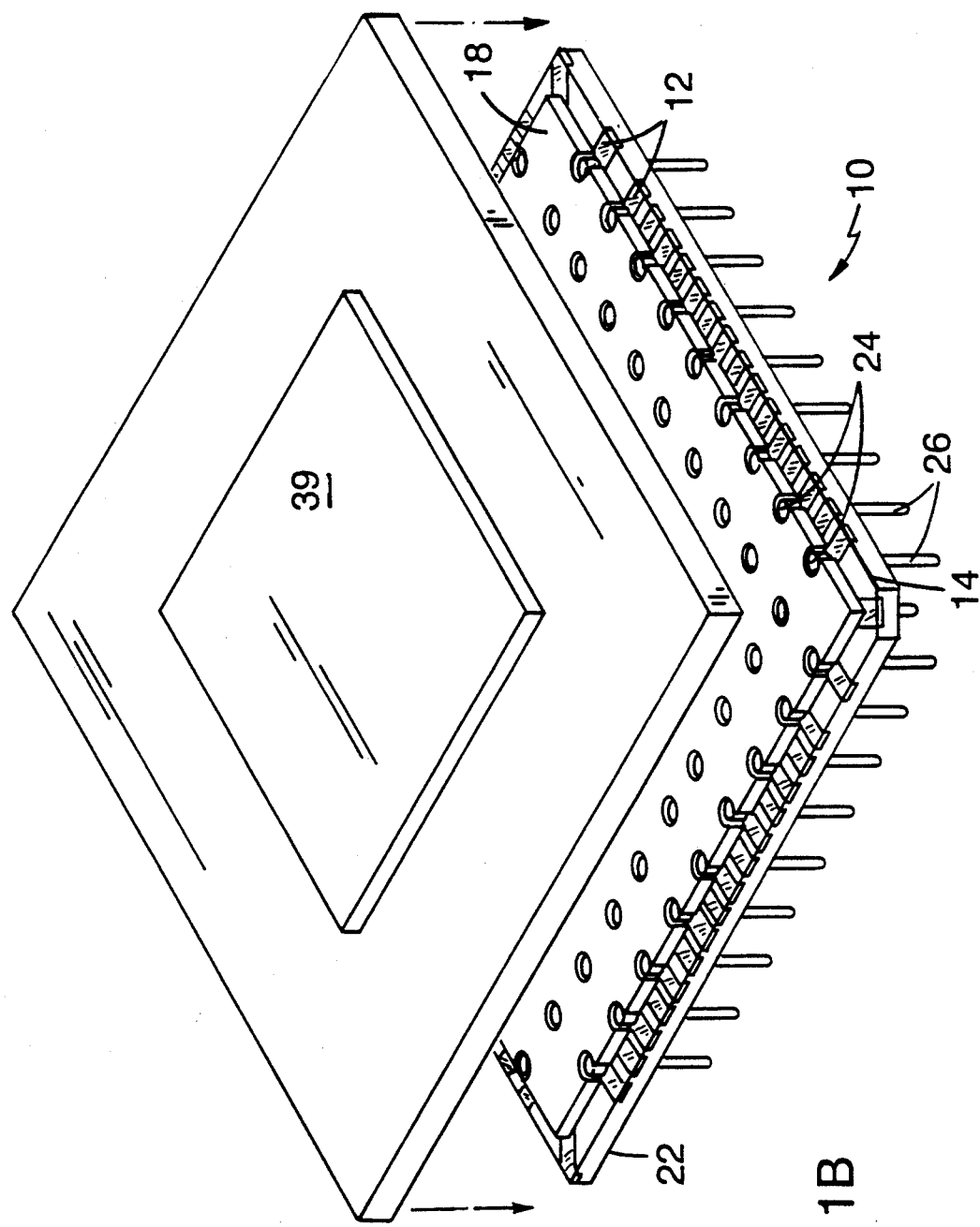

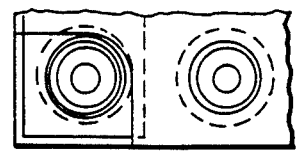
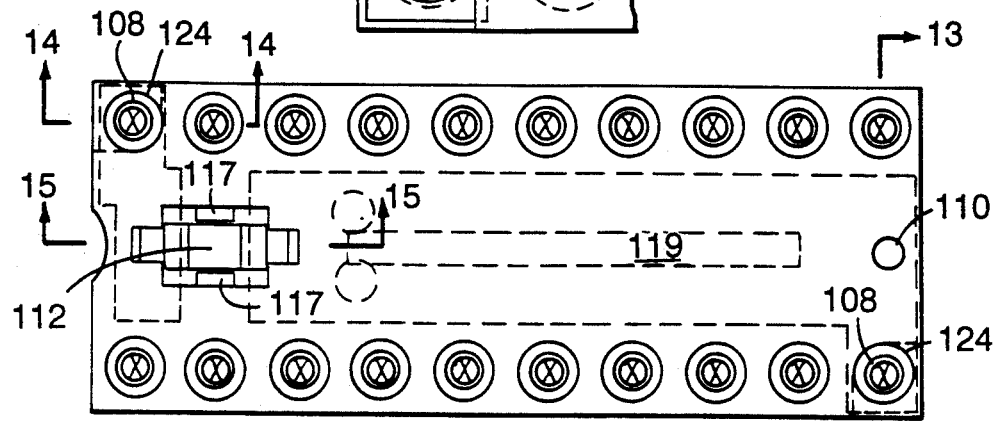
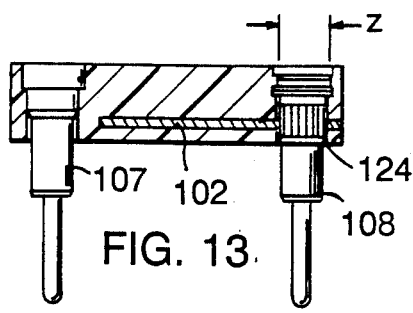
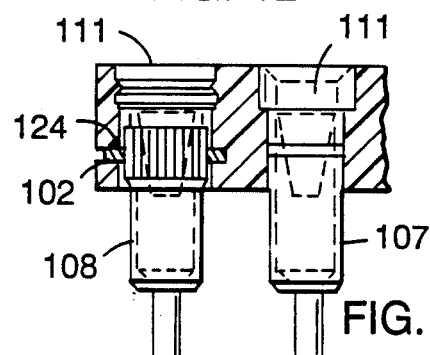
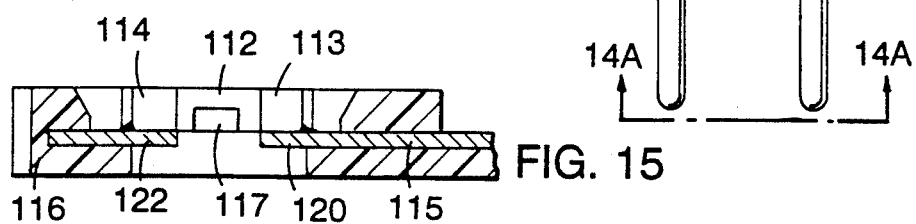
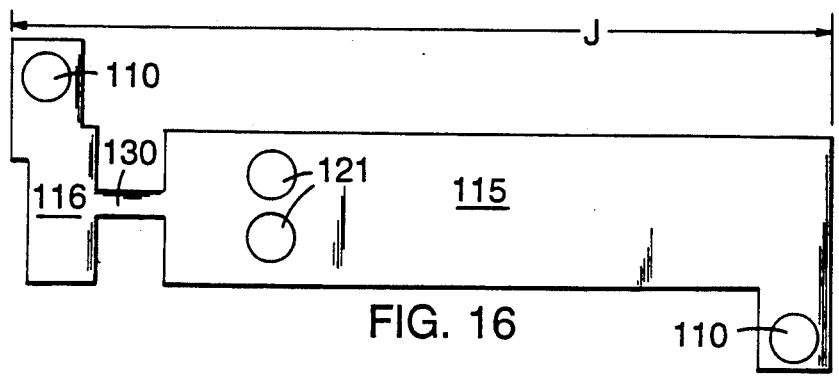

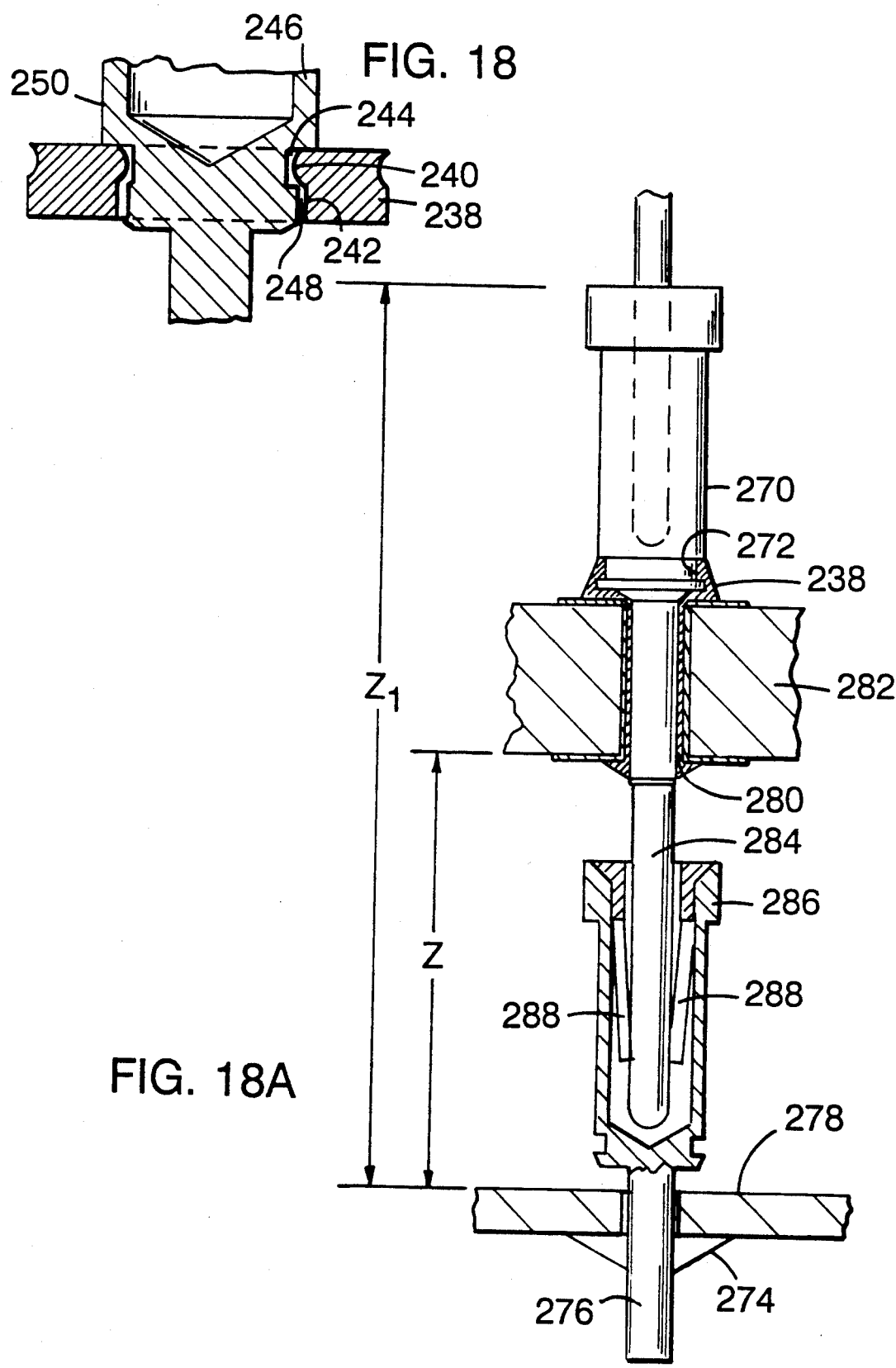

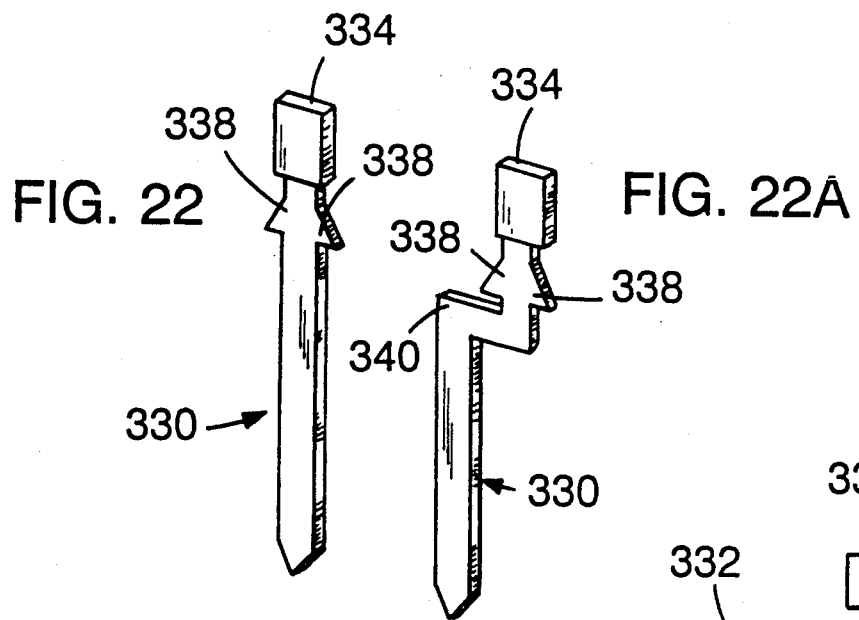
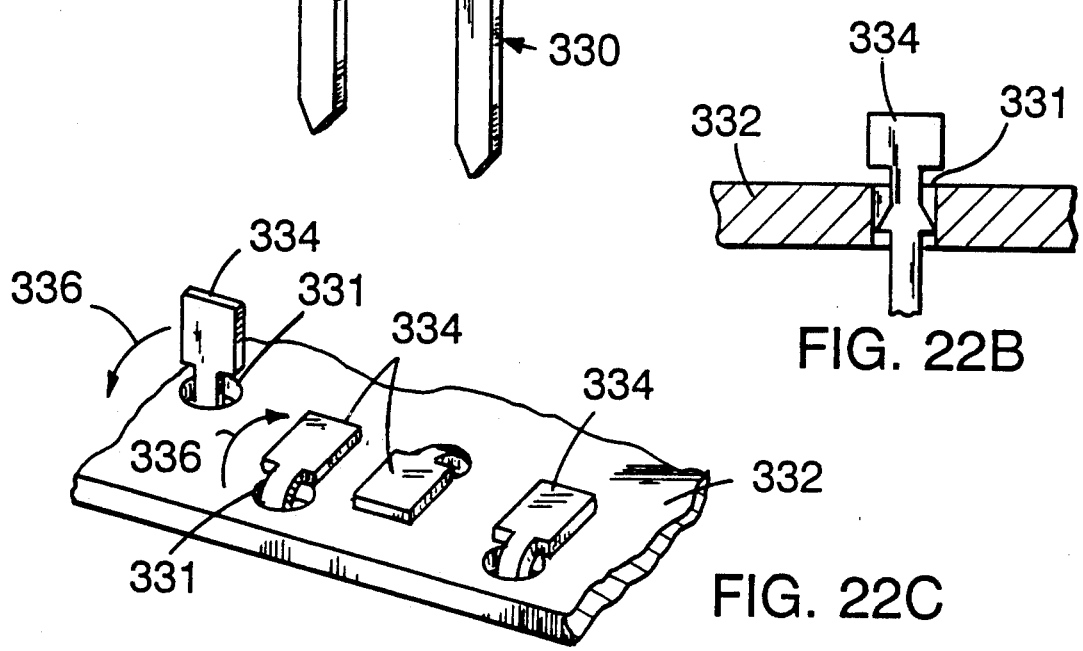
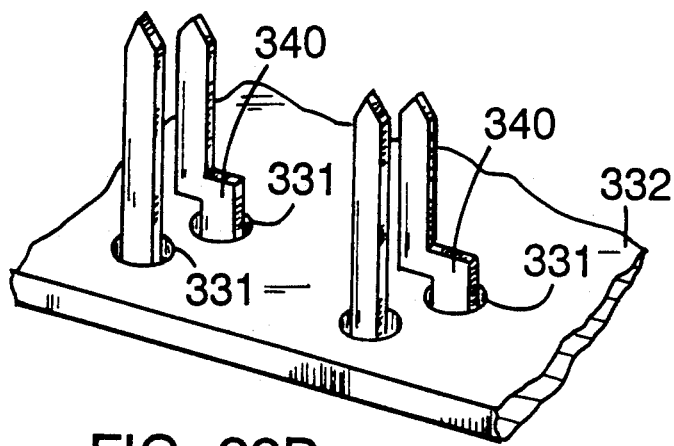

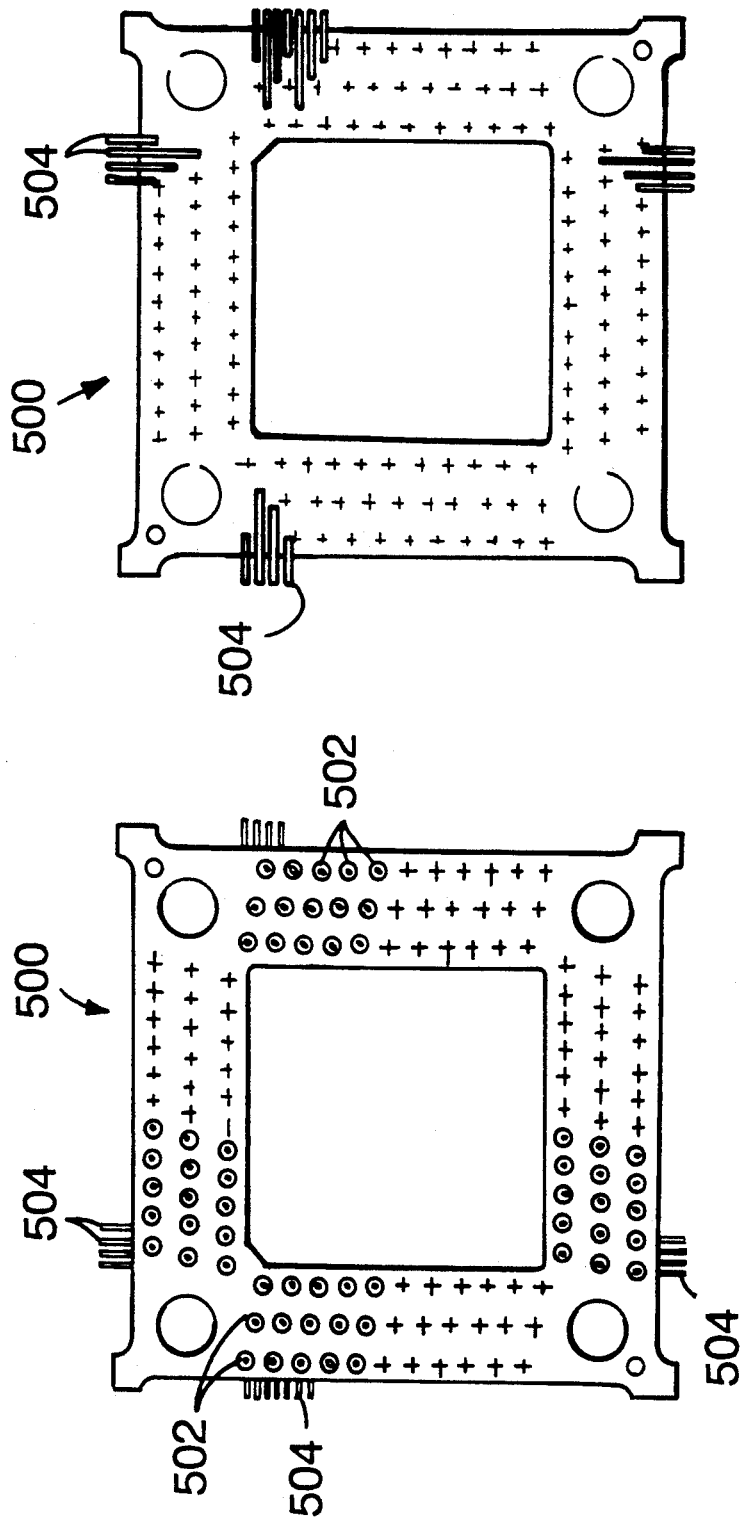

ADAPTER FOR CONNECTION OF AN INTEGRATED CIRCUIT PACKAGE TO A CIRCUIT BOARD

This is a continuation of application Ser. No. 07/272,074, filed on Nov. 16, 1988, now abandoned which is a continuation-in-part of Murphy et al., entitled MOLDED-IN LEAD FRAMES, filed Nov. 7, 1987, Ser. No. 121,568, now abandoned.

BACKGROUND OF THE INVENTION

This invention relates to adaptors and integrated circuit (IC) sockets for intercoupling electrical circuit components and terminals for mechanical and electrical connection to external components, such as those on a printed circuit (PC) or wire wrap board.

Adaptors and IC sockets are described in Advanced Interconnections Catalog No. 7 (available from 5 Energy Way, West Warwick, RI 02893). In general, they consist of a glass epoxy frame having pins which are used to electrically connect a PC board with an IC or other electrical component. They can be used as high density sockets, single-in line or dual-in line sockets, decoupling capacitor sockets, hybrid socket and board connectors, pin grid array sockets, and as J lead, gull wing and leadless adaptors and sockets.

In general, the adaptors and IC sockets are manufactured by PC fabrication. Briefly, a glass epoxy laminate having copper on both sides is drilled to produce holes for pins, and then photo etched to produce the desired circuitry. Copper is then plated through the holes to provide electrical connection for the pins. Metal, such as tin or gold, is then plated on top of the etched copper to enhance its soldering properties. A single adaptor is then routed from the laminate and pins mechanically positioned in the holes.

A preliminary novelty search of classes 339/17CF, 176M, 176MF, and 176MP, in U.S. patents, uncovered U.S. Pat. Nos. 4,598,965, 4,504,105, 4,560,216, 4,278,311, 4,381,131, 4,379,139, and 4,614,384. None discloses the concept of a molded in lead frame as described and claimed below.

SUMMARY OF THE INVENTION

In a first aspect, the invention features a lead frame suitable for use in an adaptor or socket for intercoupling electrical circuit components and terminals for mechanical and electrical connection to external components such as those on a board for carrying circuit compounds. The lead frame comprises a frame and a circuit, wherein the circuit comprises a plurality of electrical conducting elements. The elements are held in position by the frame, and each element comprises an area within the element suitable for positioning a pin through the element to electrically connect the element with the board. The lead frame can be molded in plastic and trimmed to remove the frame to leave each element electrically separate from each other element.

In related aspects, the invention features a molded lead frame comprising the above lead frame having electrically insulative material molded around the lead frame, and openings in the material and the lead frame suitable for receiving pins to electrically connect each element with the board; and an adaptor or socket comprising the above lead frame.

In a preferred embodiment, the molded frame further comprises a pin inserted through an opening into an element of the lead frame. In another embodiment a capacitor is electrically connected between two elements. The adaptor or socket may also comprise a heat sink molded into the adaptor.

In another aspect, the invention features a lead frame comprising an electrical conducting element adapted to be mounted between two pins of an adaptor or socket. The element has a removable bridge region dividing the element into two electrically separated regions, wherein each region comprises an area within the region suitable for positioning a pin through the region to electrically connect that region with a board. A capacitor can be mounted between these regions, to capacitively couple the electrically separated regions when the bridge is removed from the lead frame.

In related aspects, the invention features a molded lead frame comprising the above lead frame, wherein the lead frame has electrically insulative material molded around the lead frame, and openings in the material and the lead frame suitable for receiving pins to electrically connect each region with a board; and an adaptor or socket comprising the above lead frame.

The molded lead frame may further comprise a pin inserted into a region of the lead frame; and a capacitor capacitively coupling two regions.

In a further aspect, the invention features a method for producing a molded lead frame. The method comprises the steps of providing a lead frame having a frame and a circuit, wherein the circuit comprises a plurality of electrical conducting elements, the elements are held in position by the frame, and each element comprises an area within the element suitable for positioning a pin through the element to electrically connect the element with a board; and molding electrically insulative material around the lead frame to produce a molded lead frame having an opening positioned over the area.

In preferred embodiments, the method further comprises the steps of applying metal to the lead frame to enhance the solder accepting properties of the lead frame; pushing a pin through an opening in the molded lead frame; providing a heat sink prior to the molding step, wherein the heat sink is positioned relative to the lead frame so that it functions to remove heat from a circuit component placed in the molded lead frame; and trimming the lead frame after the molding step.

In a still further aspect, the invention features a method for producing a molded lead frame. The method comprises the steps of providing a lead frame having an electrical conducting element adapted to be mounted between two pins of a socket or adaptor, the element having a bridge with a removable region to divide the element into two electrically separated regions, wherein a capacitor can be mounted between the regions, and wherein each region comprises an area within the region suitable for positioning a pin through the region to electrically connect the region with a board; and molding electrically insulative material around the lead frame to produce a molded lead frame having an opening over at least one such area.

In preferred embodiments, the method further comprises removing the bridge region and mounting a capacitor between the regions so that they are electrically connected.

In another aspect, the invention features a spider device and method for using the device. The device is suitable for aiding in soldering a gull wing device, having connector leads, to an adaptor, the spider device comprising a plurality of elongated legs attached to an upper surface, the legs extending from the upper surface to a plane below the surface, each leg touching the plane at a position corresponding to a connector lead. In this device each leg can be positioned over a different connector lead, and the legs are suitable for exerting a downward force on these connector leads to allow contact of each connector lead with the adaptor.

In preferred embodiments the undersurface of each leg comprises an insulating material.

This invention provides adaptors and sockets which are functionally advanced over prior art devices. Since the conducting elements are formed from a lead frame, which may be produced by etching or by stamping out from a sheet of metal, they can be thicker and thus provide lower resistance and inductance than prior art devices. The invention also provides a less costly and more reliable method for making such devices since holes for pins are formed during the molding process and need not be drilled out, nor need copper be plated through the holes since the lead frame provides adequate electrical connection with the pins.

The devices produced also make it possible to mount capacitors or chips below the upper surface of the device, or even on the undersurface of the device, thus increasing the density at which such chips can be mounted and the physical security of such chips. Further, the process allows increased accuracy in the positioning of pins and circuitry in the final device, and allows the production of multi-layer devices and reel to reel production potential in which a reel of conducting material may pass through stamping, plating, molding, component inserting, terminal inserting, die attaching, wire bonding, lid attaching and assembly inserting stations.

This invention also provides a method for producing devices with precisely aligned holes for more accurate connection with sockets and/or boards carrying circuit components. The method avoids the necessity of making printed circuit boards with ceramic substrates and avoids the thermal expansion differential problems of devices produced with such substrates. The method also makes manufacture of such devices quicker and less expensive, and yet allows production of extra features, such as stand-off bumps to aid in cooling of the device or attached chips and cleaning solder flux, and allows ready construction of such devices in three dimensions. Further, the method allows production of multi layer devices.

Still further, a flexible insulating strip may carry a number of lead frames through production to facilitate automated production.

In another aspect, the invention features an adaptor for electrically connecting a plurality of terminals of a circuit chip to a circuit board. The adaptor includes a plurality of lead pins corresponding to each of the plurality of terminals and an insulated board having at least one hole for accepting each of the lead pins. The lead pins comprise a solder clad (a region of the pin where solder can be used to fix the lead pin to a chip) and a pin extending from the solder clad for friction fitting the lead pin to the insulating board.

In preferred embodiments, an elbow may be formed along the pin before it is inserted into the insulated board for aligning the pin with a female receptacle in the circuit board. The solder clad includes a step member and a hook member for positioning corresponding terminals of the circuit chip.

In another preferred embodiment, the solder clad is secured to the insulated board by press fitting a contact pin through a hole in the solder clad and a hole of the insulated board. The pin which is electrically connected to the solder clad is press fitted to another hole in the insulated board. The insulated board may include insulator spaces for electrically separating adjacent lead pins.

Other features and advantages of the invention will be apparent from the following description of the preferred embodiments and from the claims.

DESCRIPTION OF THE PREFERRED EMBODIMENTS

The Figures will first briefly be described.

DRAWINGS

FIGS. 1-9 show various views and embodiments of an adaptor package and a flexible insulating strip for supporting lead frames.

FIG. 1 is a perspective view of an adaptor carried by a flexible insulating strip and a chip displaced from the adaptor; FIGS. 1A, 1B are perspective views of the adaptor and covers; FIG. 1C is a cut away view of an alternate embodiment of the adaptor;

FIGS. 11-16 show another embodiment of an adaptor;

FIG. 11 is a partially exploded perspective view of the adaptor and a capacitor.

FIG. 12 is a diagrammatic representation of the top view of the socket;

FIGS. 13, 14 and 15 are generally sectional views of the socket at sections C—C, A—A and B—B, respectively of FIG. 12; FIG. 14A is a diagrammatic representation of the underside of part of the adaptor, shown at A—A in FIG. 12, through section D—D of FIG. 14;

FIG. 16 is a diagrammatic representation of a lead frame;

Figure 17:
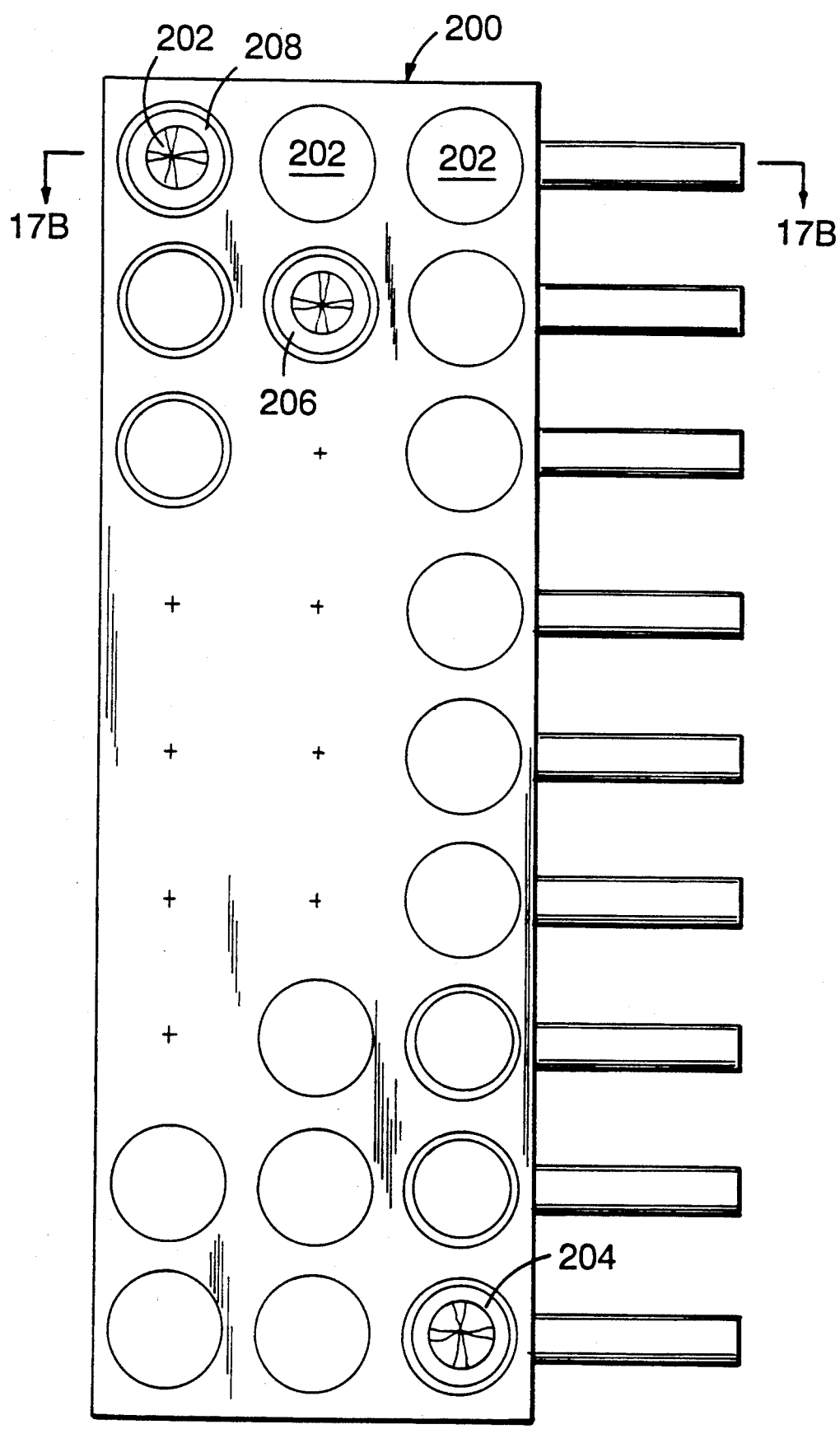
Figures 17A, 17B, 17C, 17D:
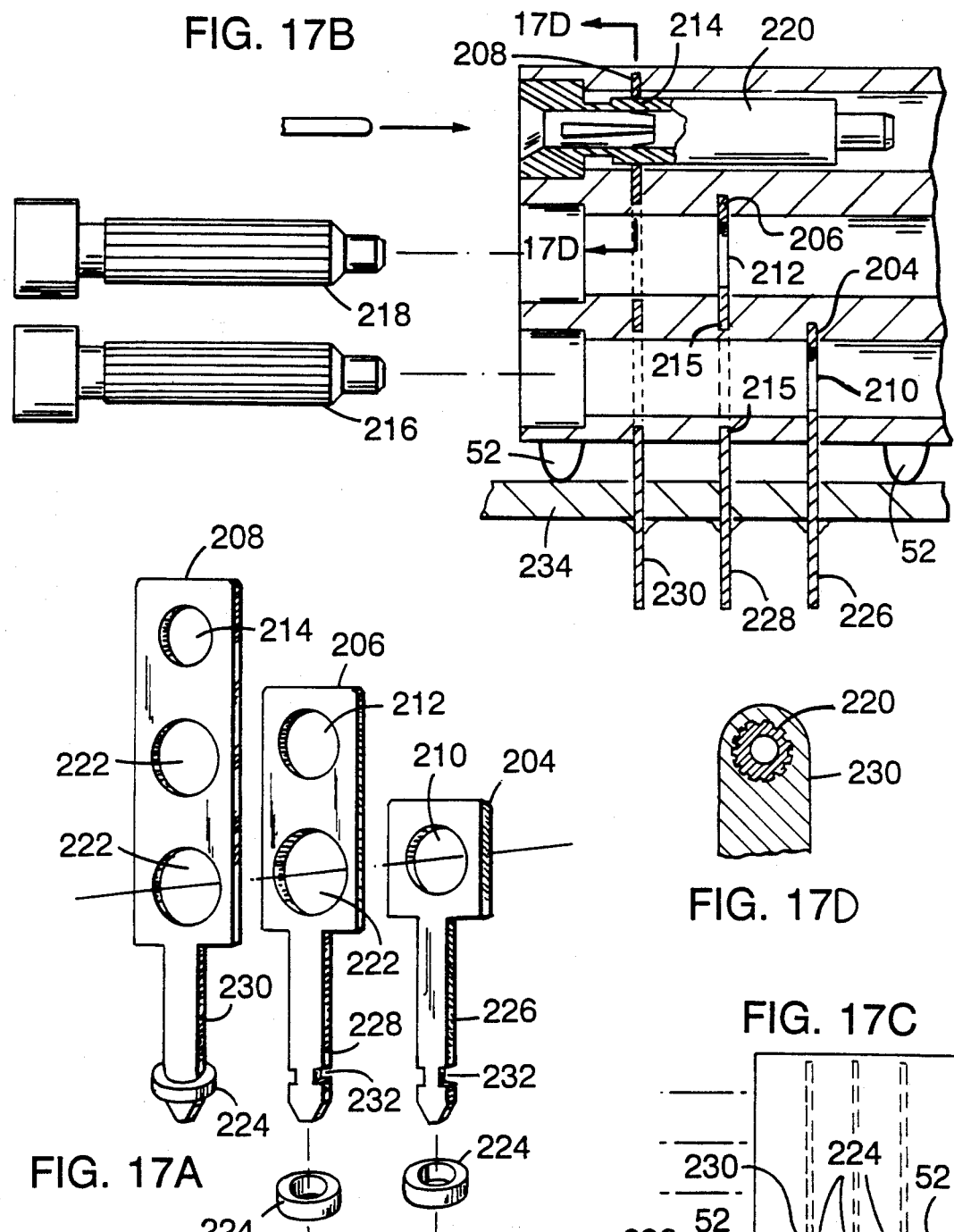
Figure 20:
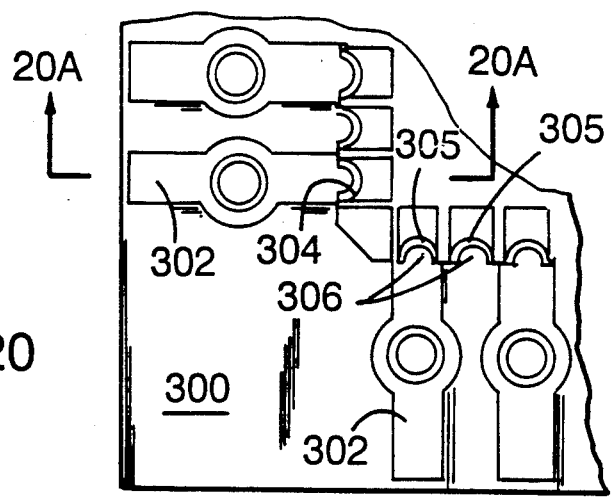
Figure 20A:
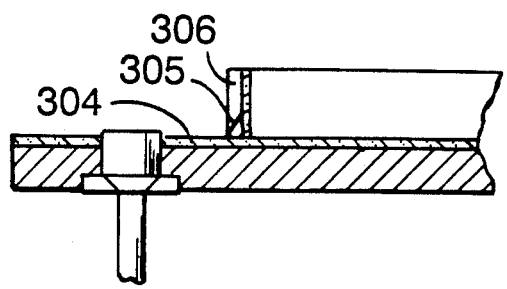
Figure 19A:
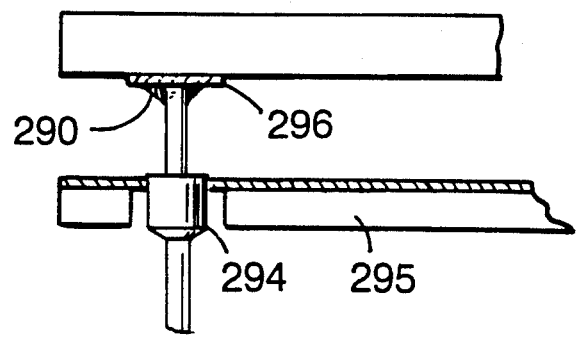
Figure 19:
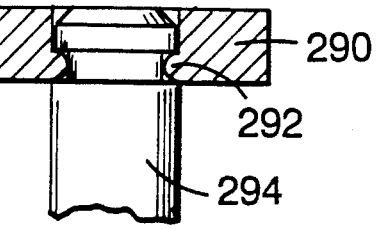
Figure 21D:
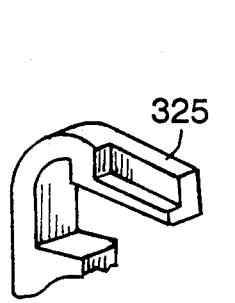
Figure 21C:
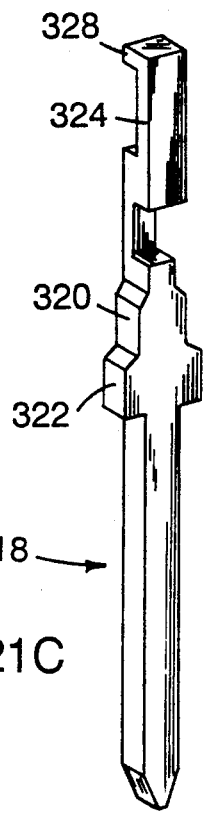
Figure 21A:
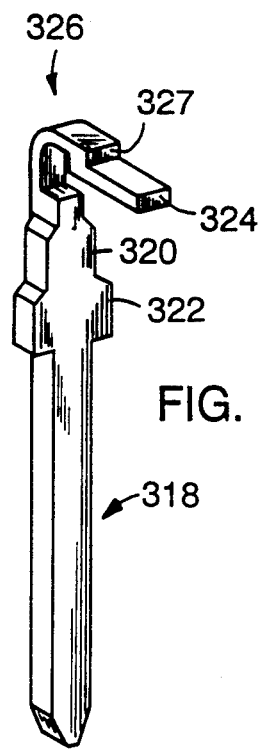
Figure 21:
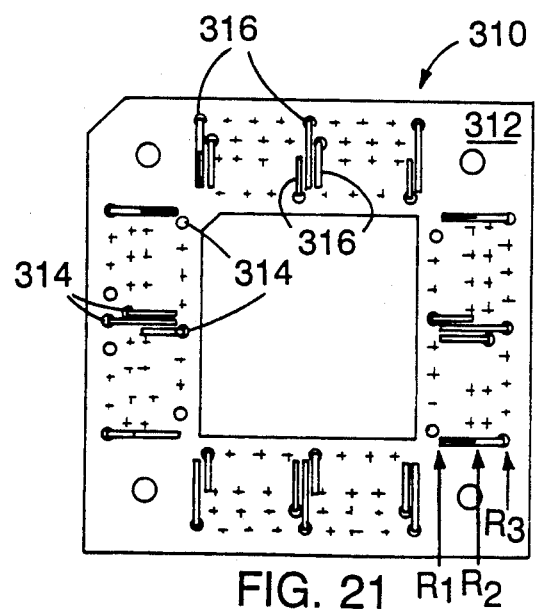
Figure 21B:
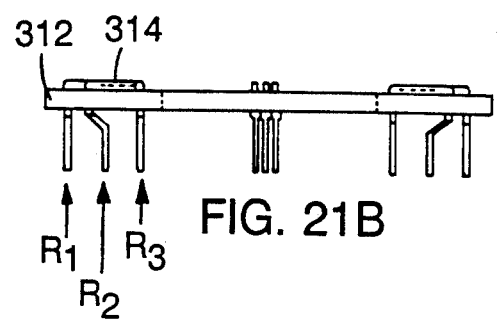
Figure 23C:
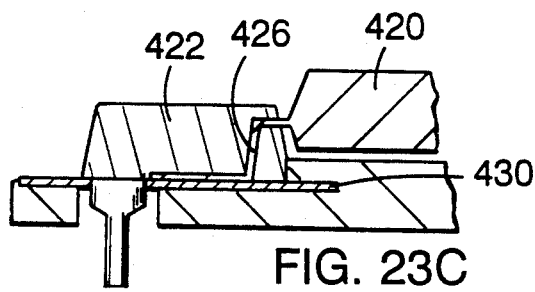
Figure 23B:
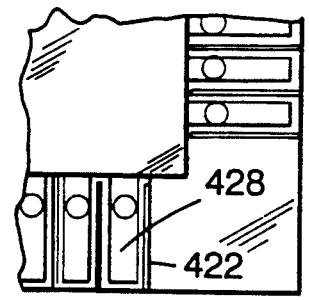
Figure 23A:
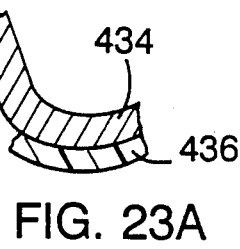
Figure 23:
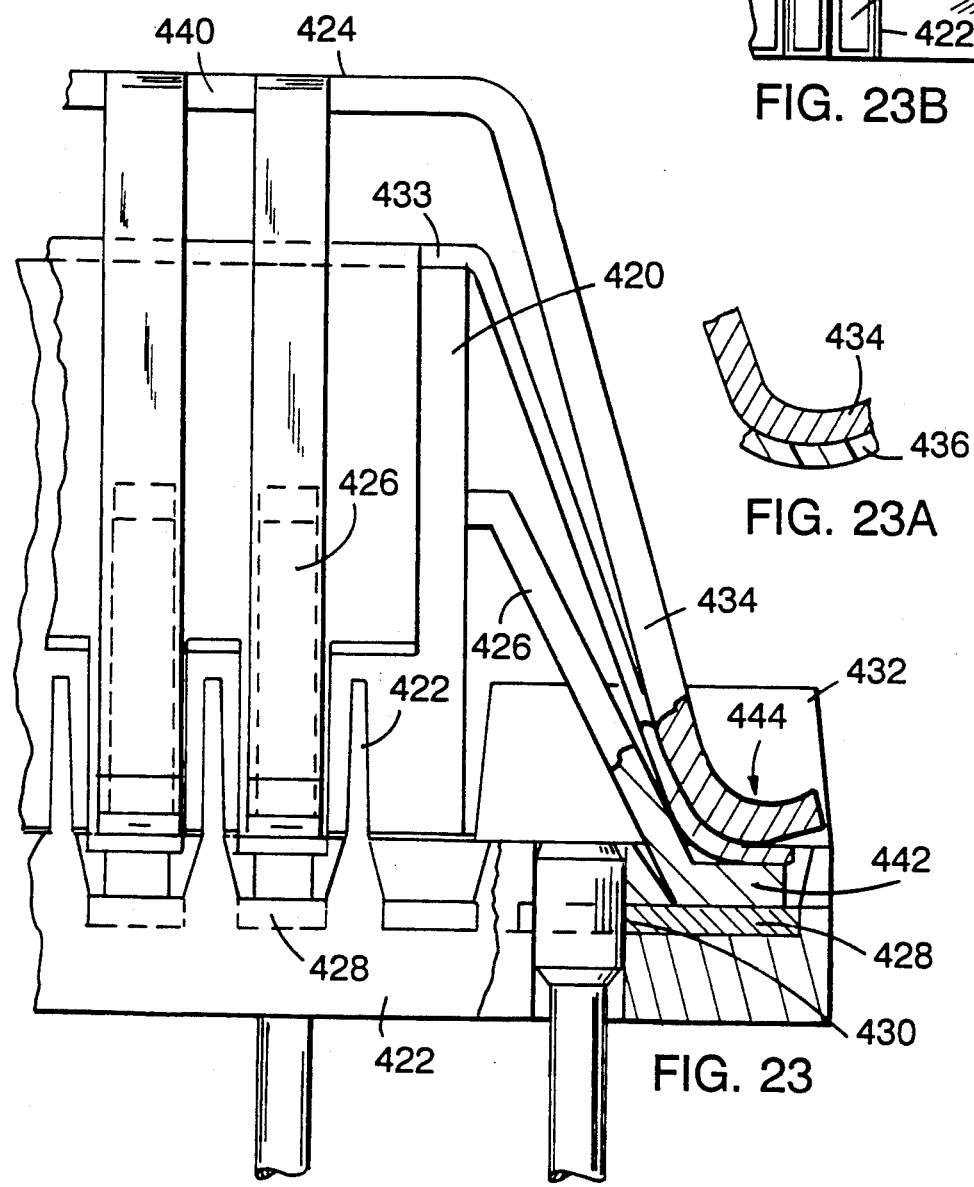
Figure 24:
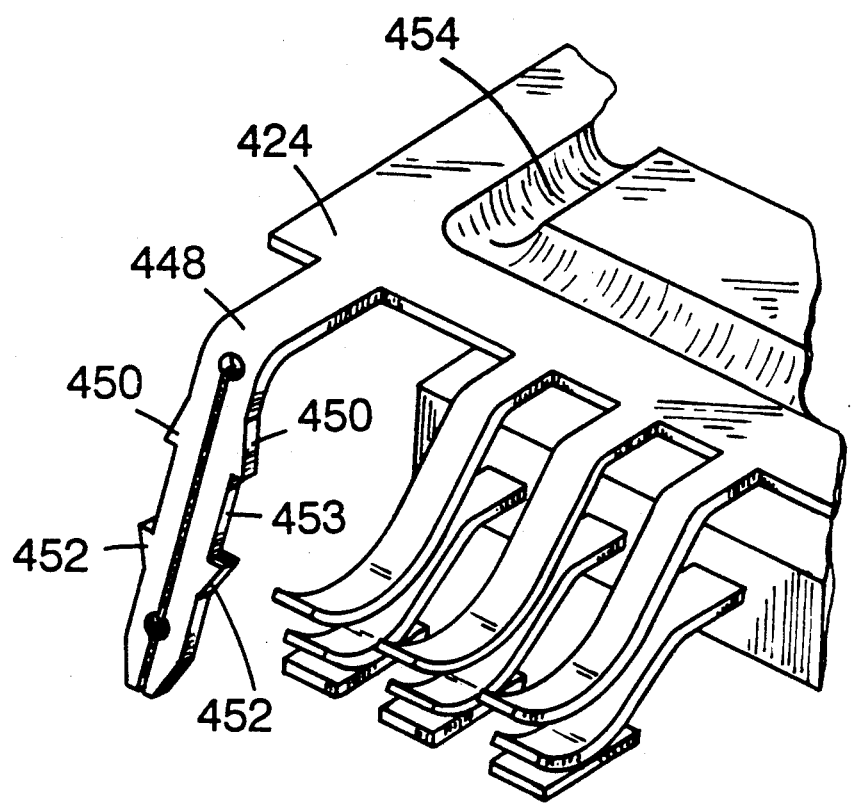
Figure 25C:
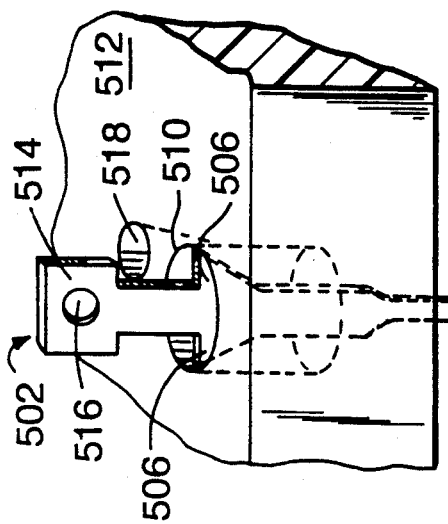
Figure 25E:
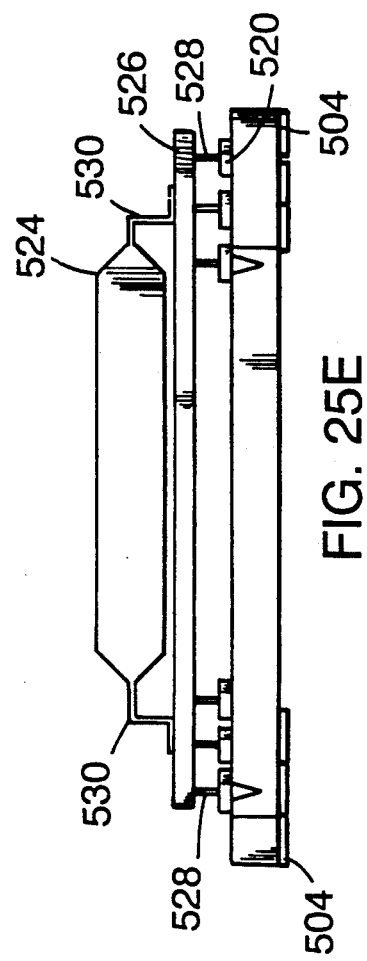
Figure 25B:
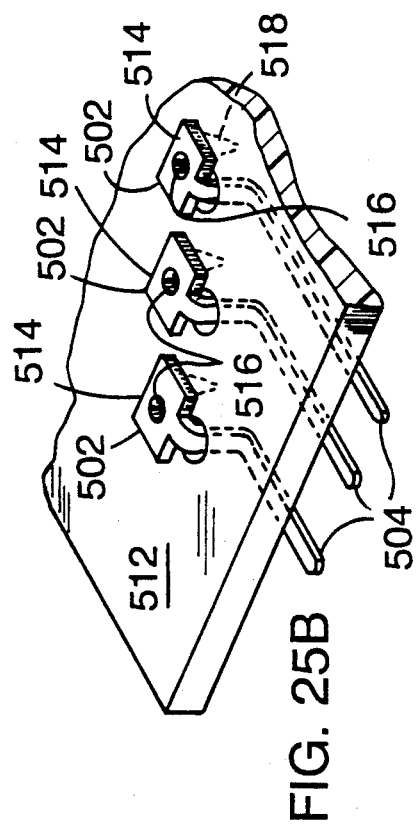
Figure 25D:
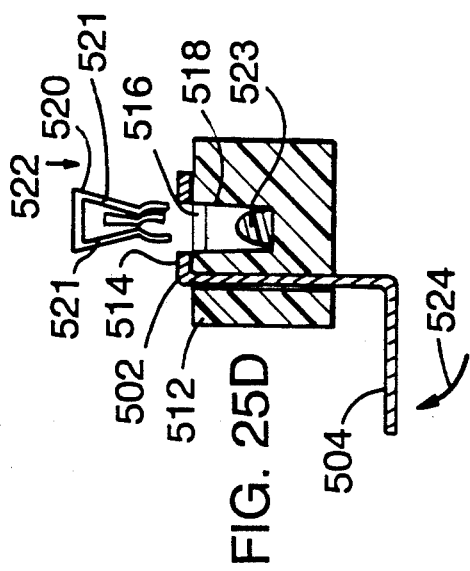

FIGS. 17—17C show various aspects of a multilevel lead frame female connector;

FIG. 17 is a diagrammatic representation of a multi-level lead frame female connector;

FIG. 17A is a perspective view of the three lead frames in the female connector of FIG. 17, and associated solder donuts;

FIG. 17B is a partially exploded sectional view of the connector of FIG. 17 at B—B;

FIG. 17C is a diagrammatic representation showing connection of the connector in FIG. 17 to a printed circuit board;

FIG. 17D is a sectional view through A—A of FIG. 17B;

FIGS. 18, 18A and 19 are longitudinal sections through a pin and associated solder donut;

FIG. 19A is a sectional view of solder and pin connection with a lead frame;

FIG. 20 shows an adaptor having an LCC connected; FIG. 20A is a sectional view at A—A in FIG. 20;

FIGS. 21-21D show various aspects of an adaptor equipped with lead pins;

FIGS. 21 and 21B are top and side views of the adaptor with lead pins;

FIG. 21A is a perspective view of a lead pin;

FIG. 21C is an alternate embodiment of a lead pin;

FIG. 21D is another embodiment of a lead pin;

FIGS. 22-22D show various aspects of a lead pin that compensates for staggered holes in an adaptor board;

FIGS. 22 and 22A are a perspective view of lead pins positioned to be inserted into adjacent rows of holes in an adaptor;

FIG. 22B is a cut-away portion of the adaptor showing a lead pin pressure fitted to a hole of the adaptor;

FIG. 22C is a top perspective sectional view of lead pins pressure fitted to adjacent rows of holes in an adaptor;

FIG. 22D is a bottom perspective sectional view of lead pins pressure fitted to adjacent rows of holes in the adaptor;

FIGS. 23-23C show various aspects of a spider device suitable for fastening a gull wing chip to an adaptor;

FIG. 23 is a perspective and partly sectional view of the device held in position over a chip and adaptor;

FIG. 23A is an alternate embodiment of a spider device;

FIG. 23B is a cut away portion of an adaptor suitable for attachment of a gull wing chip;

FIG. 23C is a partially sectional view of a gull wing chip attached to an adaptor;

FIG. 24 is a partially sectional view of a leg of the gull wing chip device;

FIGS. 25-25E show various aspects of a surface mount adaptor socket;

FIGS. 25 and 25A are a top and bottom view of an adaptor socket;

FIGS. 25B and 25C are sectional views of lead pins fitted to an adaptor socket;

FIG. 25D is a cut away portion of an adaptor socket showing a lead pin secured to the adaptor socket by a contact pin; and FIG. 25E is a side view of a gull-wing chip attached to an adaptor socket.

Figures 26, 26A:
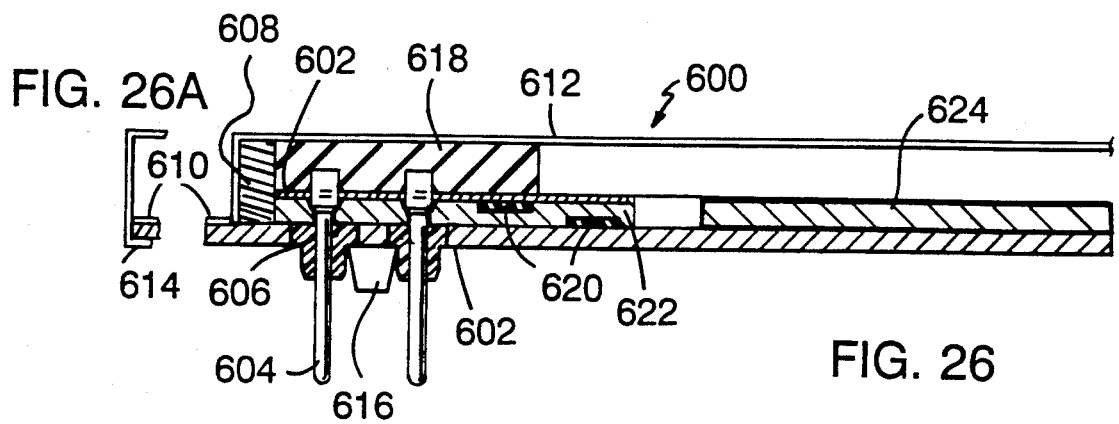
Figure 27:
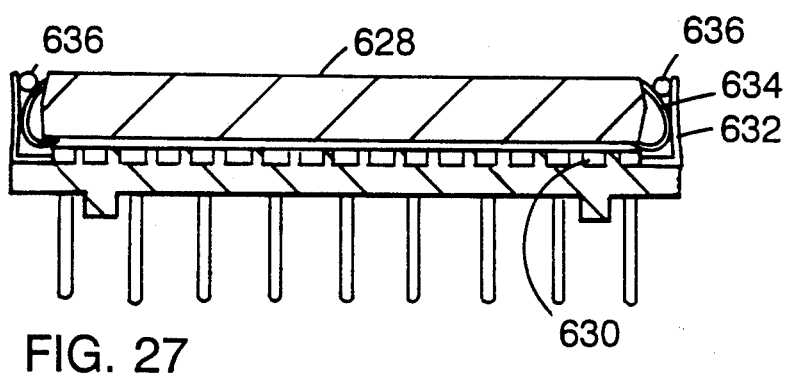
Figure 27A:
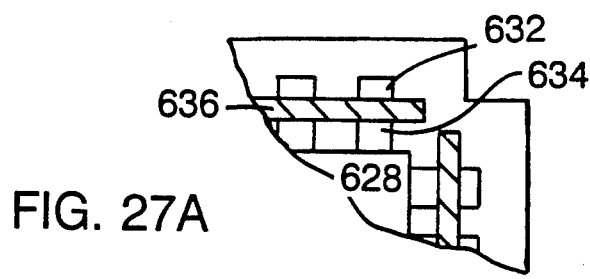

FIGS. 26 and 26A are sectionals view through an adaptor having an extended heat sink and associated lid;

FIG. 27 is a sectional view through an adaptor having extended leads for attachment to a J-lead chip device; FIG. 27A is a diagrammatic top view of solder strips used to solder the adaptor to the chip device.

Figure 28:
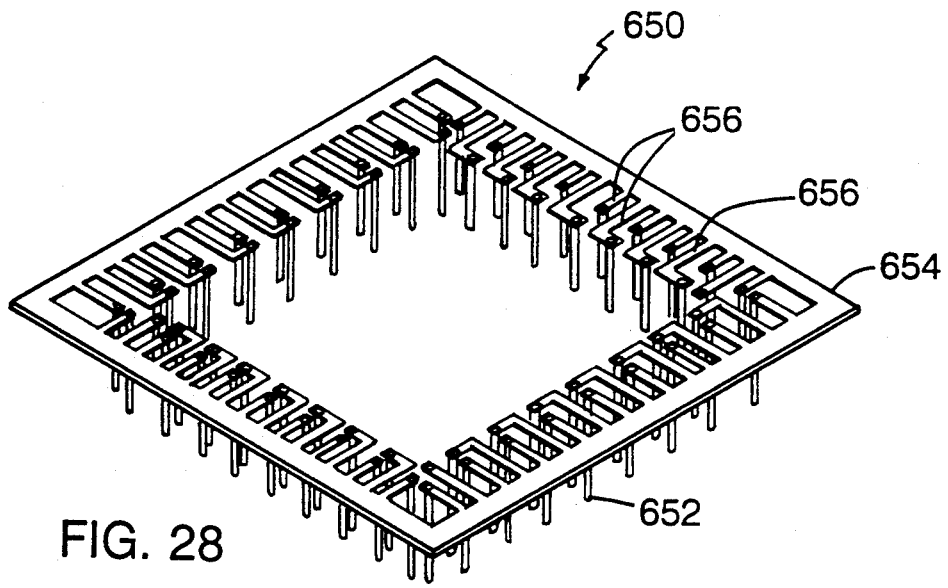
Figure 29:
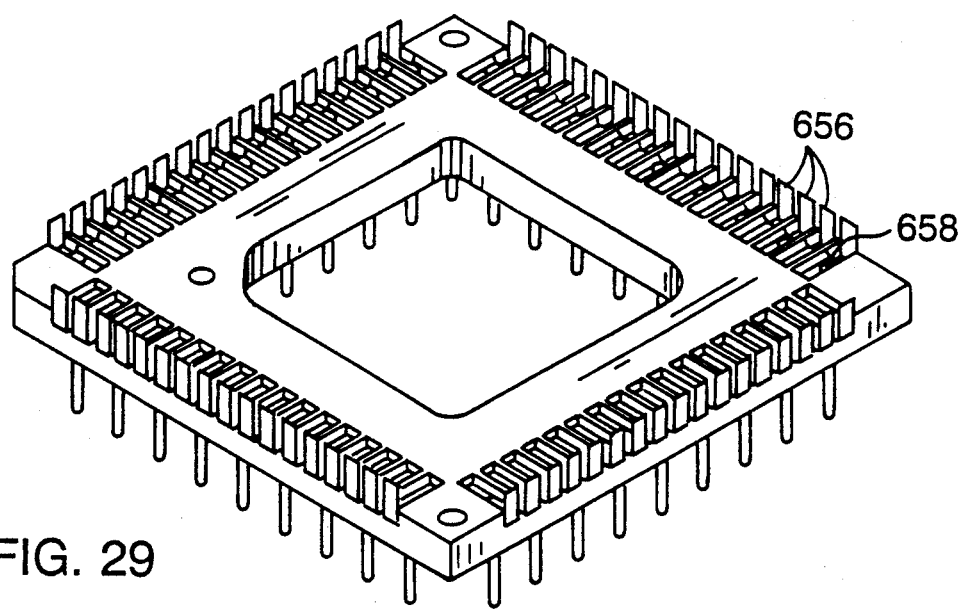

FIG. 28 is an isometric view of an alternative method of assembly of an adaptor; and FIG. 29 is an isometric view of an assembled adaptor positioned ready to receive a J lead chip.

STRUCTURE

Figure 4:
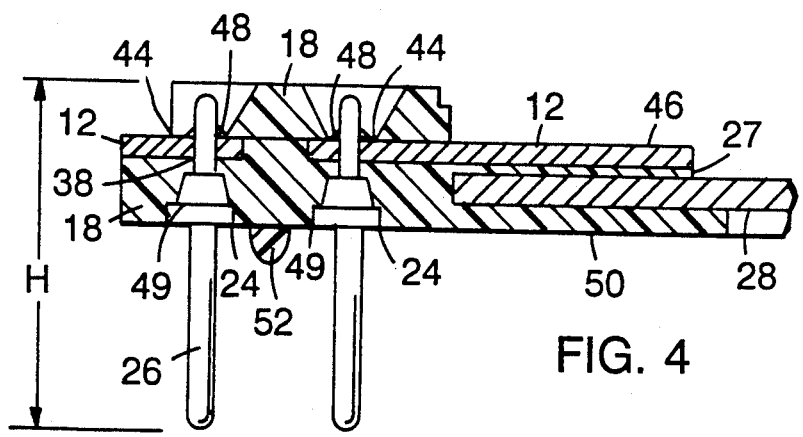
FIGS. 4 and 5 are generally sectional views of the adaptor at sections A—A and B—B, respectively in FIG. 3.

Referring to FIG. 1, adaptor 10 is provided with a series of electrically conducting copper elements 12 which run from the outer perimeter 14 of the adaptor to the inner perimeter 16. Elements 12 are molded within an electrically insulative material 18, which may typically be LCP, or epoxy, having an upper surface 20 and a lower surface 22. Also provided are holes 24, which pass from upper surface 20 to lower surface 22 and are interrupted to some extent by elements 12 (FIG. 4). Pins 26 are force fit into holes 24 and soldered in place in electrical connection with elements 12. Heat sink and chip carrier 28 is positioned below the level of elements 12 at inner perimeter 16, such that it may conduct heat away from chip 30 when the chip is positioned in adaptor 10, as shown by arrows, 32. Heat sink 28 is separated from chip 30 by insulating film 27 attached to elements 12 and heat sink 28 during encapsulation. Chip 30 has electrically conducting elements 34 corresponding in position to elements 12 at the inner perimeter 16 of adaptor 10. When chip 30 is correctly positioned, each corresponding element 34 and 12 is wire bonded together, to separately connect each chip terminal 34 electrically with each pin 26 in adaptor 10.

Referring to FIG. 1C, in another embodiment, adaptor 10 is molded so that upper surface 20 surrounds each of holes 24.

Figure 1A:
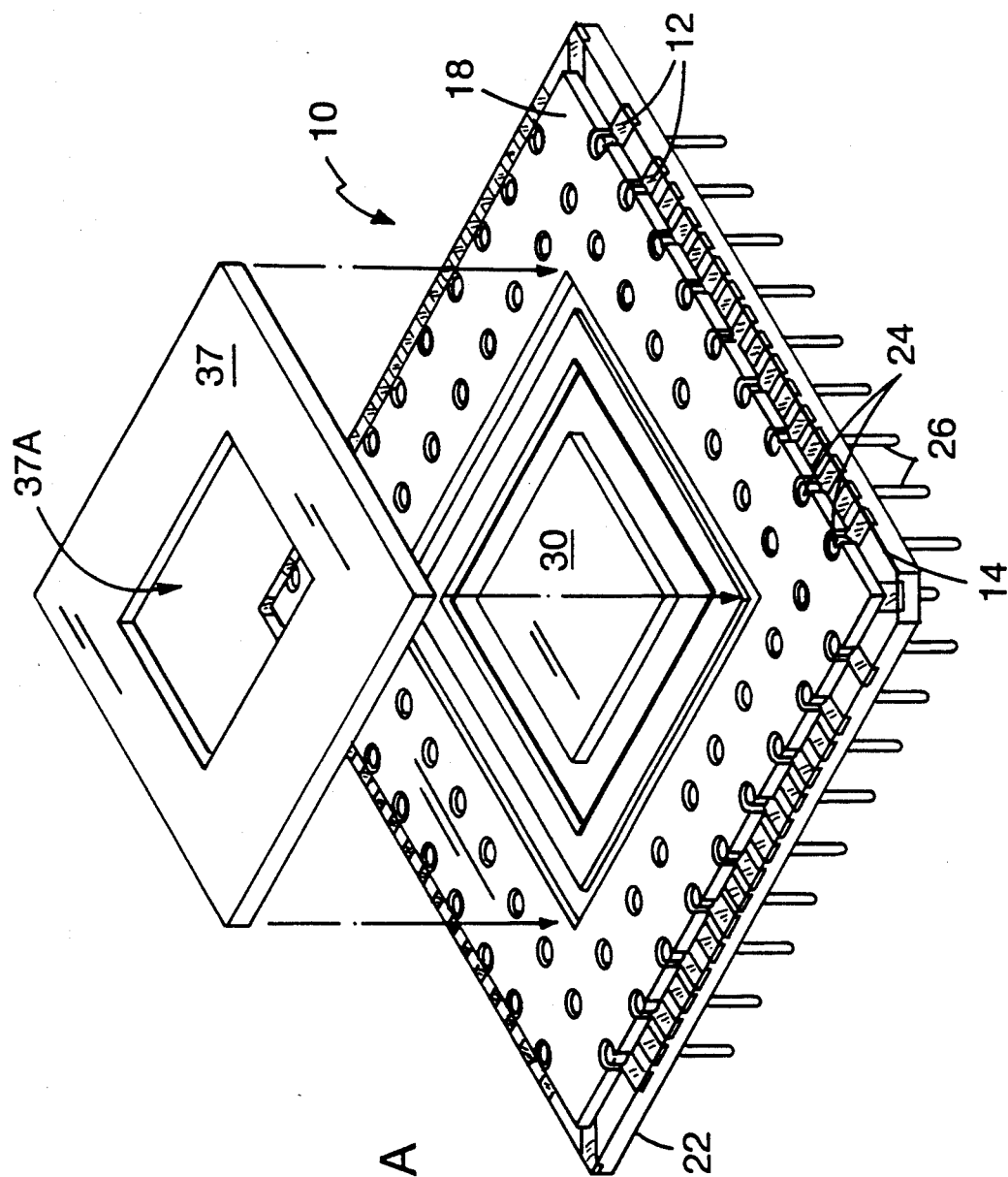

Referring to FIGS. 1A and 1B, two covers 37, 39 and RTU insulating glob (not shown) are provided for adaptor 10. These may protect IC chip 30 from damage (cover 37) or both the chip and adaptor (cover 39). Smaller cover 37 is particularly useful for allowing circuit testing of the adaptor while still protecting IC 30, since pins 26 are accessable from upper surface 10 when the bottom of pins 26 are connected to a circuit. An opening 37A in the small cover 37 allows the RTU insulating glob placed on chip 30 to cure more rapidly.

Figure 2:
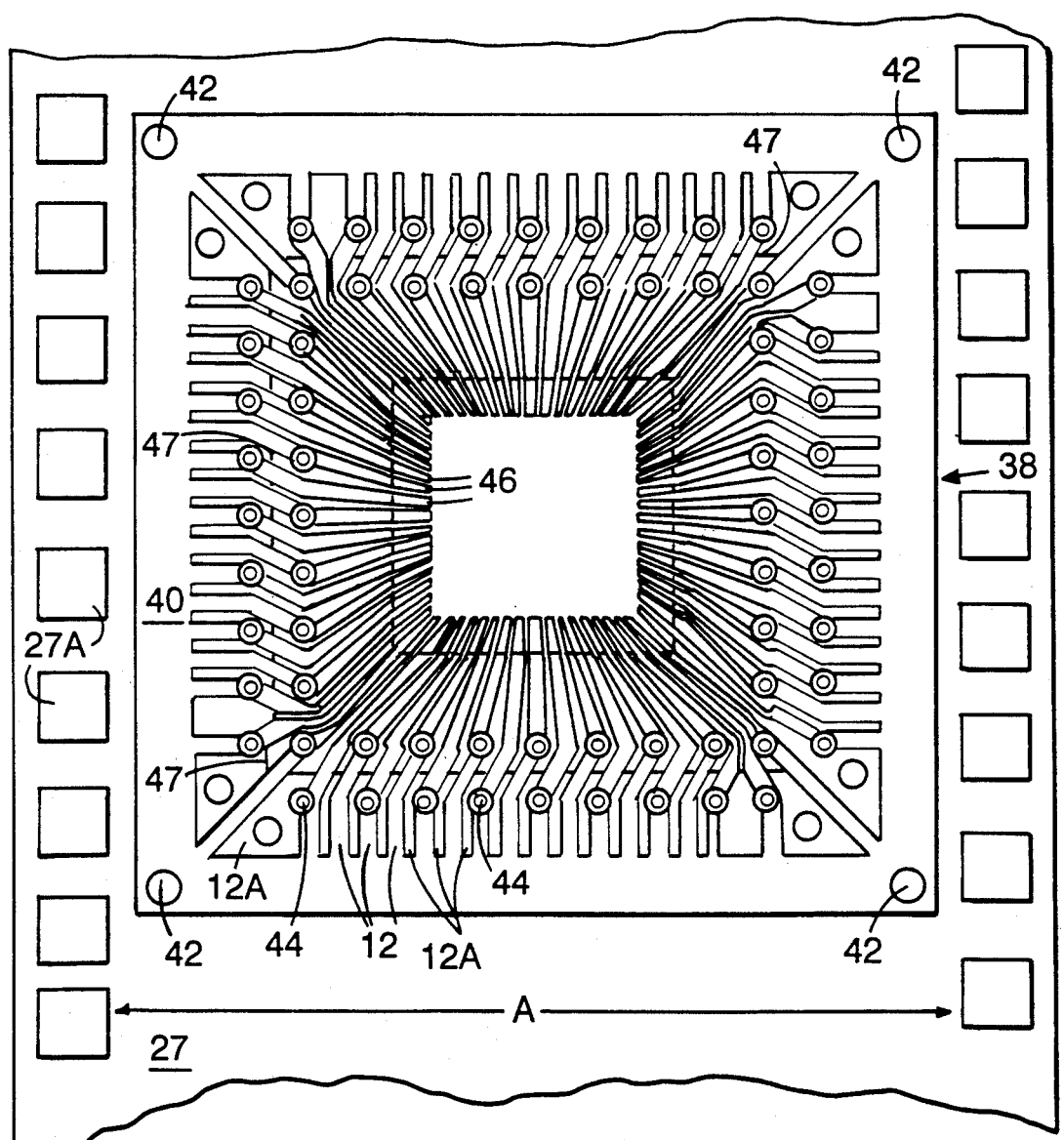
FIG. 2 is a diagrammatic representation of a lead frame.

Referring to FIG. 2, a lead frame 38 suitable for forming the adaptor of FIG. 1 is shown. The lead frame consists of a square frame 40, having a width A, of about 1.4" at each edge, to which electrical conducting elements 12 are attached. Holes 42 are provided in frame 40 and are used to position the lead frame when it is being molded and attached to insulated film 27 to produce adaptor 10. Each element 12 is provided with a hole 44 of diameter about 0.046" through which a pin 26 will be positioned to form adaptor 10. Spaces 12A between each element 12 are filled with electrically insulative plastic material using a mold.

The inner shaded length 46 and area around holes 44 of each element 12 is plated with gold for a distance of about 0.06". The inner set of pin holes 44 is separated from the outer set by about 0.1" and may be smaller, 0.05", for example. Other dimensions are apparent from the drawing, which is drawn to scale.

Figure 3:
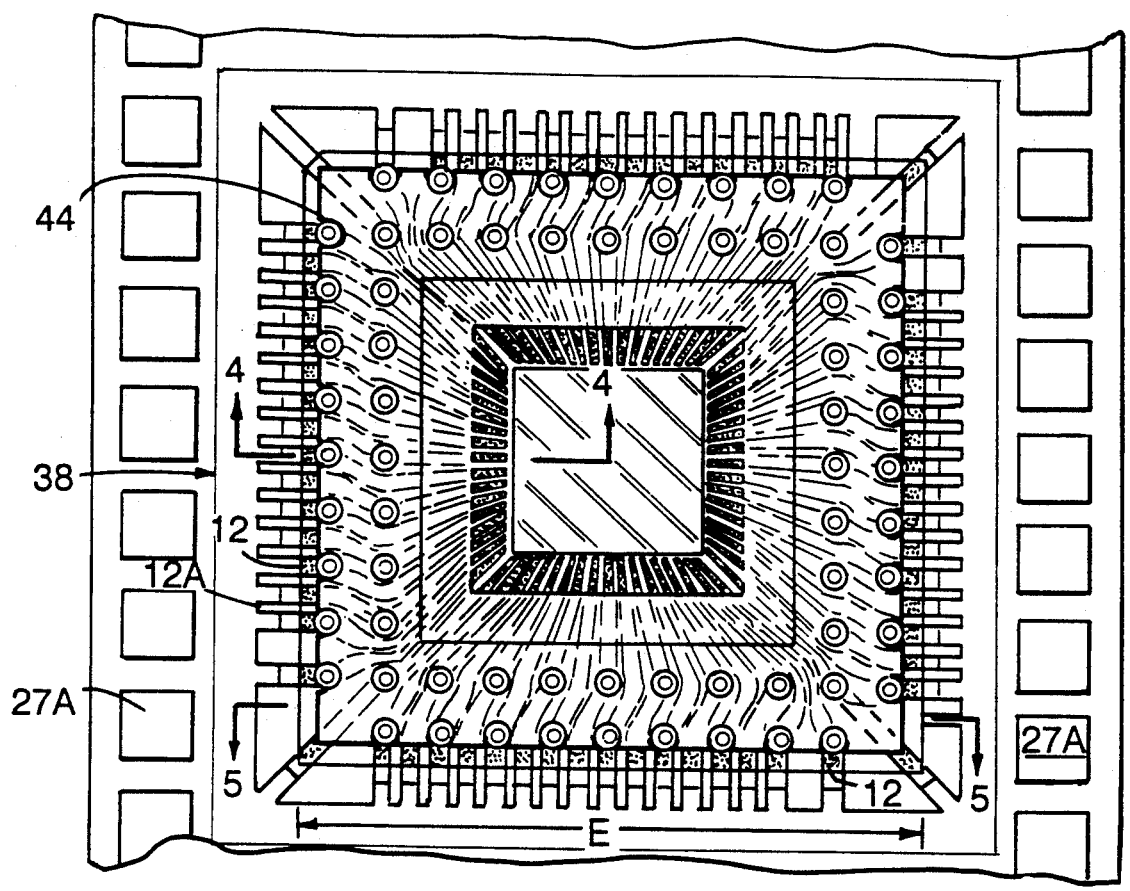
FIG. 3 is a diagrammatic representation of the upper surface of the adaptor.

Referring to FIGS. 2 and 3, there is shown a plan view of adaptor 10 on insulated film 27. Insulated film 27, which may be mylar or Kapton⊥, may be formed with sprocket openings 27A along each edge for engaging sprockets of a drive wheel in an automated system, with film 27 carrying the lead frame and heat sink through the assembly process to a roll of completed adaptors. This roll facilitates safe transport, in relatively inexpensive packaging, and dispensing of adaptors for use. An inner square area of Kapton⊥, shown by dashed lines 47 is removed from Kapton⊥ area 27 prior to use.

Figure 5:
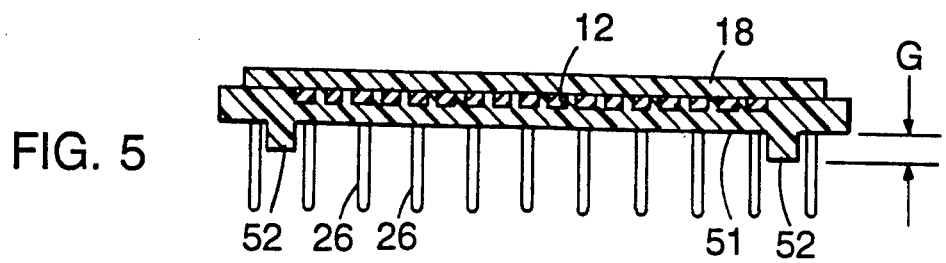

Referring to FIG. 4, adaptor 10 has a width E (FIG. 3) of about 1.1" at each edge and is formed from lead frame 38, after trimming to remove frame 40. Pins 26 are positioned through holes 24 in the insulating material 18 and holes 44 in lead frame 38. These pins are force fit into holes 24 and contact elements 12 at these holes. Collars 49, which are an integral part of each pin 26, prevent stress on an element 12 when a pin 26 is bent. Each element 12 is electrically connected with a pin 26. Pins 26 may also be soldered with solder 48 to element 12 at hole 44 through opening 48 of about 0.082" diameter Heat sink 28 is positioned below the level of the wire attach area 46, of element 12, by insulated film 27 glued to elements 12 and heat sink 28. Pins 26 are solid pins of length H, about 0.25", which may be received by holes in a board or socket suitable for carrying circuit components Referring to FIG. 5, the location of stand off pegs 52 of depth G, about 0.05", on the undersurface of adaptor 10, is shown. These pegs are used to ensure correct location of adaptor 10 during use. That is, the lower surface 51 of adaptor 10 will be 0.05" above the upper surface of a board in which pins 26 of the connected adaptor 10 are inserted.

Figure 6:
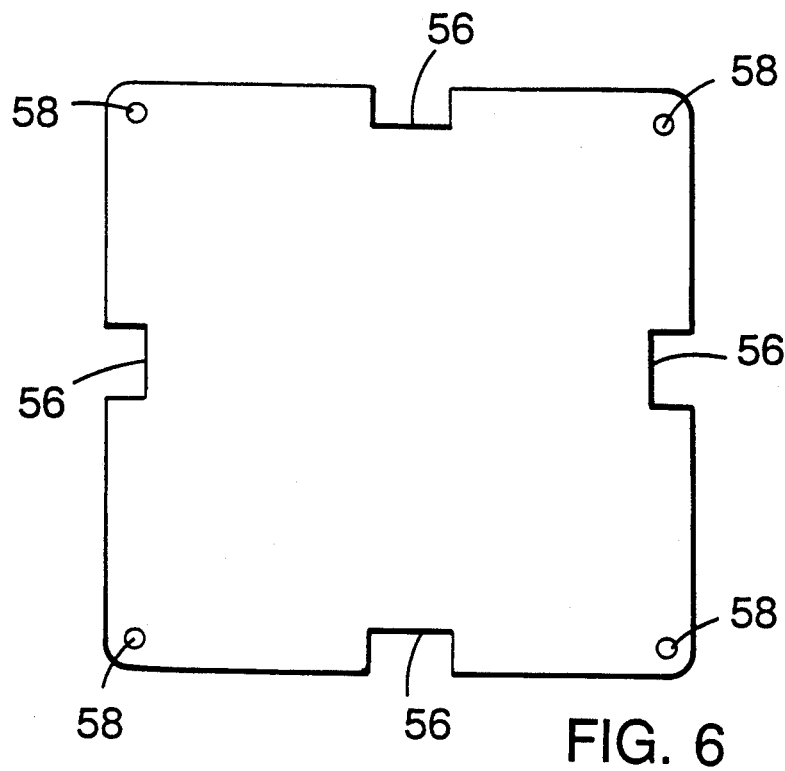
FIG. 6 is a diagrammatic representation of a heat sink.
Figure 7:
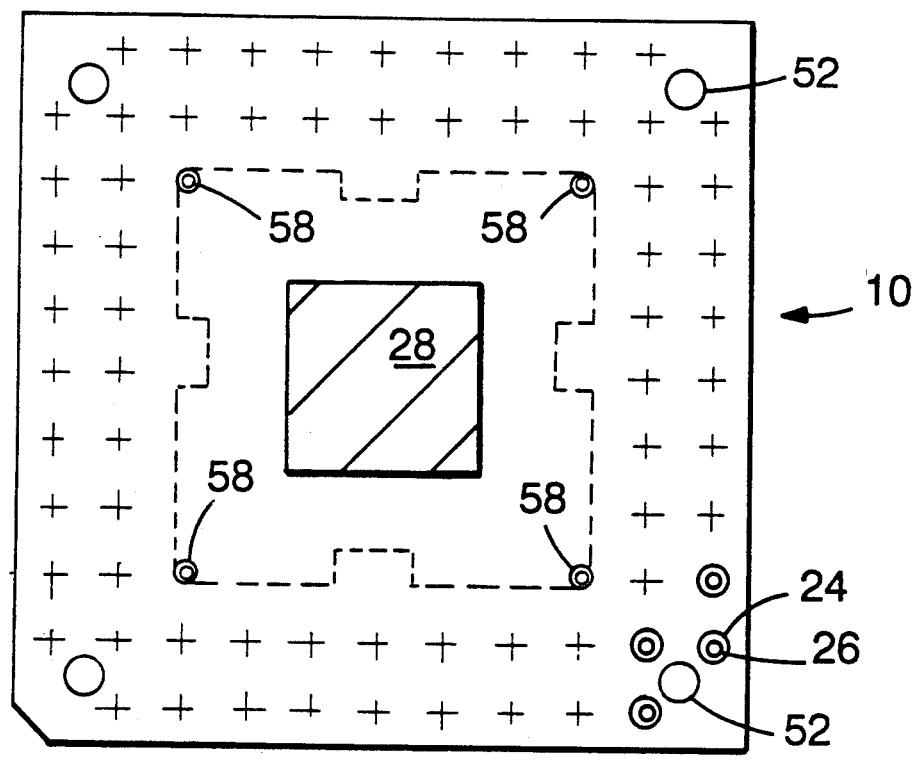
FIG. 7 is a diagrammatic representation of the upper surface of the adaptor.

Referring to FIGS. 6, and 7, heat sink 28, which also functions as a site for attaching chip 30, has four holes 58 of about 0.032" diameter. The four holes 58 are used to locate heat sink 28 relative to lead frame 38, during manufacture. Holes 58 may be used to attach heat sink 28 to insulated film 27 with lead frame 38 on the other side of film 27. Heat sink 28 is preferably a square shape to provide a larger surface area at less expense. Notches 56 are formed along the midportion of each side to help lock heat sink 28 into position when it is molded within adaptor 10.

Figure 7A:
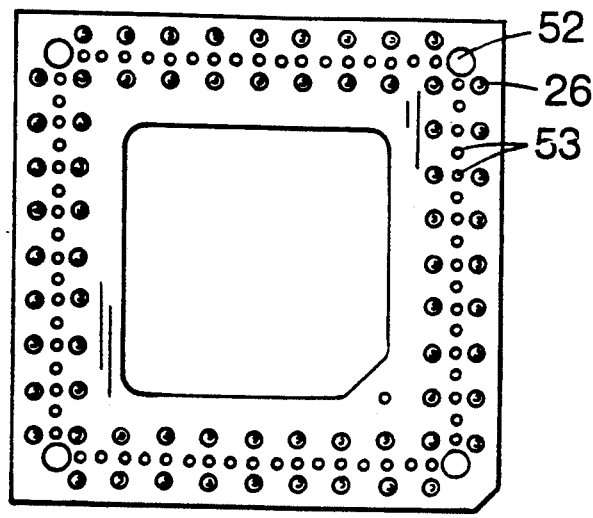
FIG. 7A is a diagrammatic representation of the upper surface of an alternative embodiment of an adaptor.

In another embodiment, shown in FIG. 7A, butt pin holes 53 are provided as a series of holes between each row of pins 26. Butt pin holes 53 are provided only to aid in molding of the adaptor since they help to relieve tensions during molding and provide less chance of buckling of the adaptor.

MANUFACTURE

Lead frame 38 is constructed from 102 copper alloy ½ hard, of thickness about 0.006" (or 0.012" when used for a double lead frame for greater mechanical strength and improved electrical properties) as one of a set of lead frames in a 12" by 16" metal block, each lead frame being separated by 0.012" gaps. The lead frames can be constructed by standard etching techniques with a 0.002"/side etch factor, or may be stamped out from a metal sheet. It is preferred to plate the lead frame at solder positions with at least 0.0002" bright acid tin, and at regions 46 (where connection to a chip is made) with at least 0.0001" nickel and 0.00005" gold.

Figure 8:
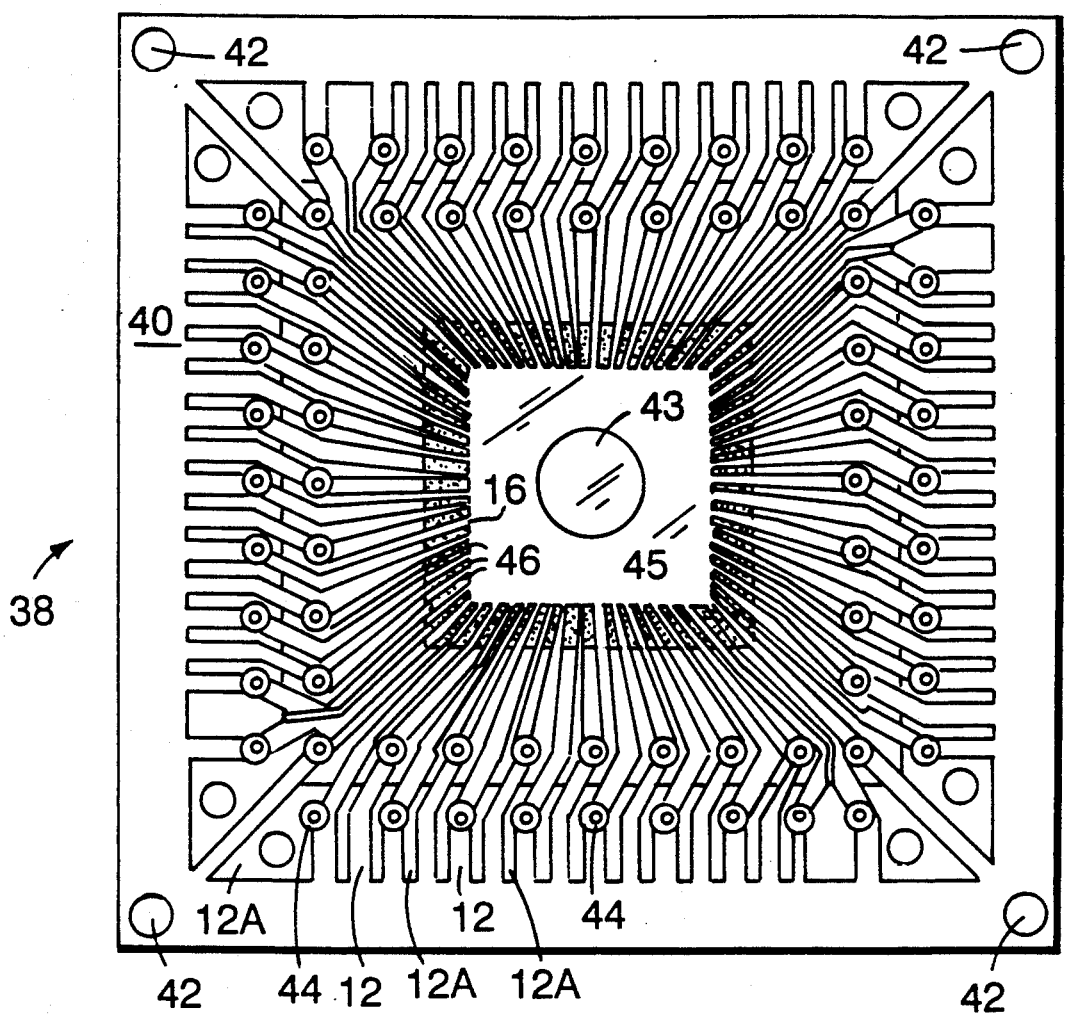
FIG. 8 is a diagrammatic representation of a lead frame having plastic insulating material molded between its elements.
Figure 8A:
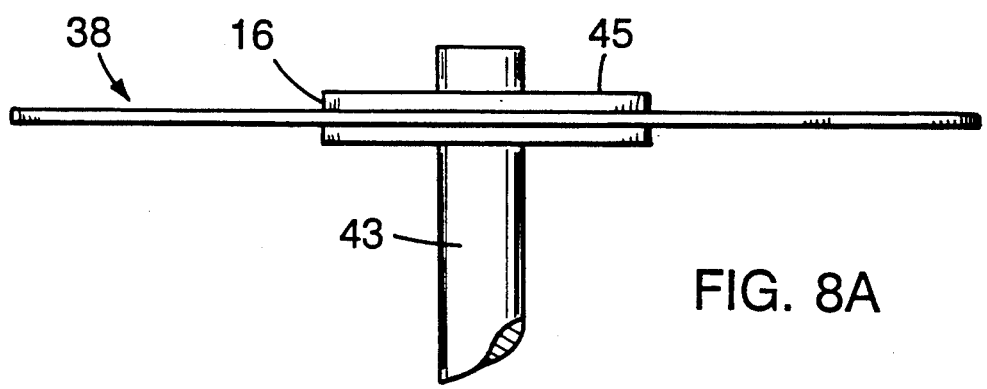
FIG. 8A is a side view of the lead frame of FIG. 8.

Referring to FIGS. 8 and 8A, spaces between each element 12 are filled with electrically insulating plastic material using a mold (not shown). Preferably the mold has projections along the inner perimeter 16 of lead frame 38. A plastic tube 43 may then be inserted through inner perimeter 16 and insulating material injected into spaces 12A using conventional molding processes, generally called a first shot molding process. Excess plastic 45 along inner perimeter 16 is removed and lead frame 38 is placed on Kapton TM film 27. Lead frame 38 is centered over a hole 47 in film 27 using holes 42 to properly align the lead frame (FIG. 3). Both Kapton TM film 27, which has a layer of glue, and lead frame 38 are heated to melt the glue to attach lead frame 38 to Kapton TM film 27. The next step in the fabrication process is called a second shot molding process. During this step heat sink 28 is attached to lead frame 38 and insulative plastic molded around lead frame 38, film 27 and heat sink 28.

Heat sink 28 is constructed from 110 E.T.P. copper alloy ½ hard, of thickness about 0.02", by standard etching techniques with a 0.002"/side etch factor, or by stamping out. They are made on a 12" by 16" sheet with about 0.05" spacings. The copper is plated with at least 0.0002" bright acid tin, and at solder joints around holes 58 with at least 0.0001" nickel and 0.00005" gold.

The lead frame 38 and heat sink 28 are molded into electrically insulative plastic material LCP using a mold which has projections positioned above and below holes 44 in lead frame 38 and with projections to hold holes 42 of the lead frame and holes 58 of heat sink 28 in appropriate positions. To electrically insulate the elements from the heat sink, plastic material is allowed to fill an area between heat sink 28 and element 12. Alternately, electrically insulative Kapton TM film may be placed between heat sink 2 and lead frame 38 prior to the second shot molding process. Further, the mold prevents accumulation of plastic above the heat sink and within the inner perimeter of the adaptor and an area about the inner and outer edges of each element 12, as shown in FIG. 3.

After molding, frame 40 of lead frame 38 is electrically isolated from elements 12 so that tests can be performed to test the electrical independence of each element 12. Frame 40 is isolated from elements 12 by punching out a small segment of each element 12 leaving a web of film 27 to support lead frame 38. Pins 26 are thereafter inserted through each hole 24 and 44, shown in FIGS. 2 and 3, respectively. Each pin is friction fitted in place and soldered in contact with elements 12. Alternatively electrical checks may be run prior to pin insertion, using a free test pin. Finally, a chip 30 and a cover 37 are placed over heat sink 28 and glued in place. An advantage of the above-described reel-to-reel manufacture is that the adaptors formed may be tested for electrical continuity while on film 27. Faulty adaptors may be removed from film 27, while other adaptors are completed.

Figure 9:
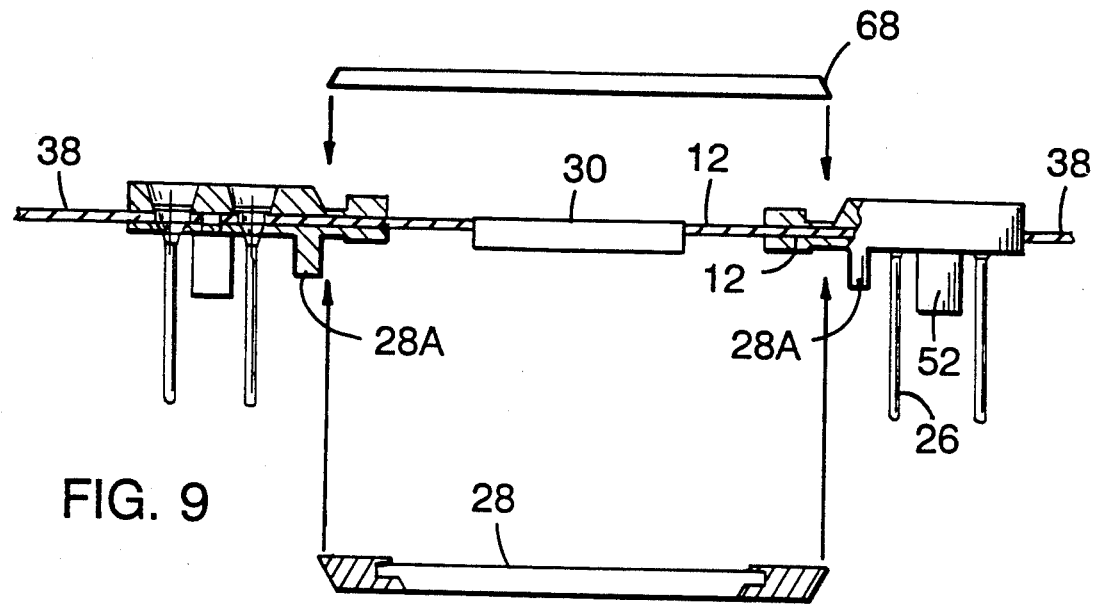
FIG. 9 is an exploded sectional view of an adaptor.
Figure 9A:
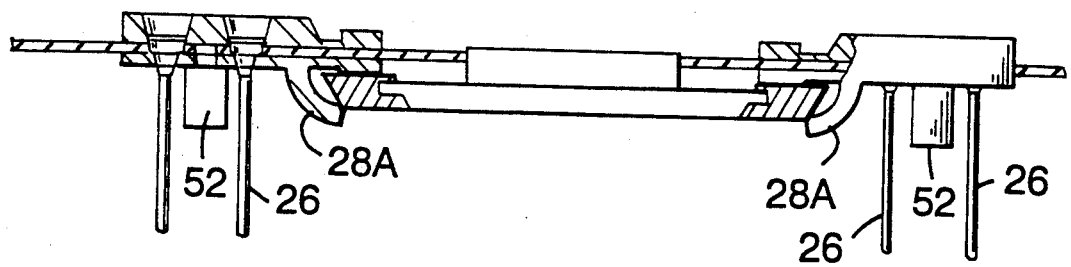
FIG. 9A is a diagrammatic representation of the lower surface of an alternate embodiment of the adaptor.

In an alternative method, shown in FIGS. 9 and 9A, lead frame 38 and heat sink 28 may be separately molded and connected together by molding tabs 28A around heat sink 28. Also shown is a cover 68 placed over chip 30 to prevent its dislodgement, and to protect it from environmental factors.

In yet another method, described in more detail below, pins may be inserted within a lead frame prior to molding and the pins and lead frame then placed within a mold having holes and grooves suitable for accepting the pins and lead frame. A heat sink may also be placed appropriately. After placement a second mold is made around the lead frame. This results in an adaptor shown partially in FIG. 4A.

USE

The above described method of manufacture can be used to produce devices, such as the adaptor described, and also to produce most of the known and used adaptors and sockets, for example, those described by Advanced Interconnections, cited above. Specifically, the method can be used to form adaptors for surface mounting of chips, plastic molded pin grid arrays for packaging chips, decoupling capacitor sockets, leadless chip carriers, and in fact almost any circuit can be molded as described above. It is also possible to use this method to produce devices having electrical leads, formed from a lead frame, which can be bent around the molded plastic to lie on the outer perimeter surface of an adaptor, rather than on the upper surface of the adaptor. The devices produced can be used in the same way as equivalent prior art devices.

OTHER EMBODIMENTS

Figure 10B:
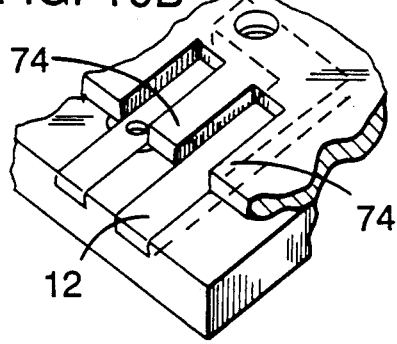
FIGS. 10, 10A and 10B are diagrammatic sectional views of adaptors suitable for accepting J-lead chips.
Figure 10:
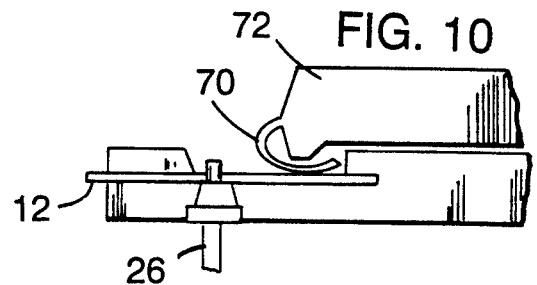
Figure 10A:
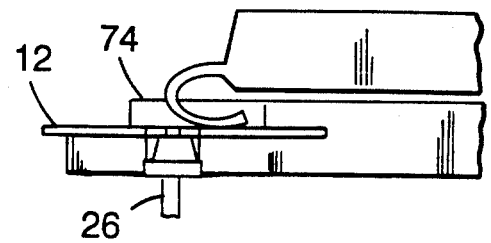

Other embodiments are within the following claims. For example, as shown in FIG. 10, an adaptor may be constructed such that element 12 is exposed sufficiently to be soldered to a J lead chip carrier 72. J lead 70 of chip 72 is thus electrically connected to element 12 and then to a board via pin 26. In FIGS. 10A and 10B is shown another embodiment of an adaptor having walls 74 which prevent J leads from contacting more than one element 12, which prevent solder from spreading from one element to another, and which allow inspection of the solder joint. The adaptor of the invention may be readily constructed to accommodate other shaped leads on chips, using the above described techniques.

Figure 11:
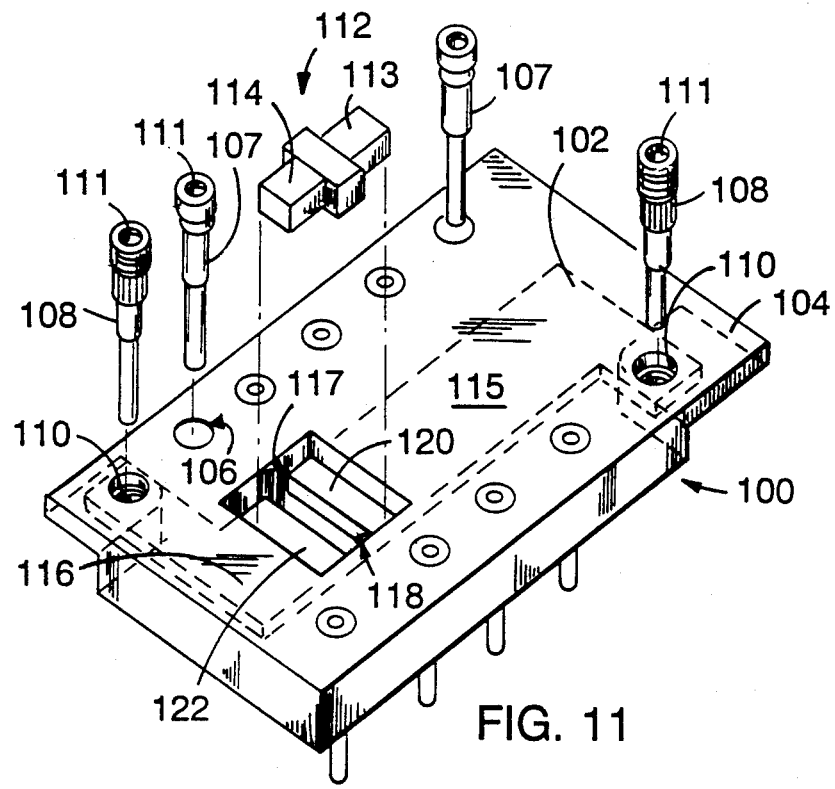

Referring to FIG. 11, a dual in line IC socket 100 is shown in an exploded view. Socket 100 is provided with a lead frame 102 molded into the electrically insulative material, Vectra TM (C130U.L. rated 94 V-O) 104 having holes 106 (of diameter about 0.057") through which pins 107, 108 are inserted. Lead frame 102 has two pin holes 110 of diameter about 0.056" through which pins 108 pass. Pins 108 contact lead frame 102 when fully inserted into adaptor 100 (as shown in FIGS. 12, 13). Each pin has a hollow top area 111 to which an IC D.I.P. (dual in line package) or other circuit component may be connected. Also provided is a capacitor chip 112 with regions 113, 114, which electrically connect the two regions 115 and 116 of lead frame 102 when positioned in receptor hole 118 by contacting ends 120 and 122, respectively, of lead frame 102; centering bumps 117 suitable for centering chip 112 to prevent it being soldered in askew or off center; and a slot 119 (FIG. 12) in the undersurface of socket 100, created by inclusion of a beam in the die used to form the adaptor, this beam prevents lead frame 102 from being bent by plastic flowing into the die.

Figure 11A:
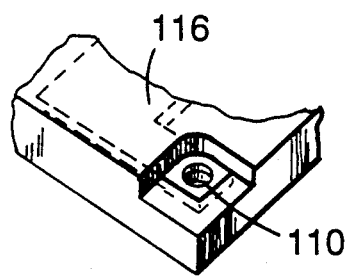
FIG. 11A is a perspective view of the underside of part of the adaptor shown in FIG. 11.

Referring to FIG. 11A, a detail view of the area around pin hole 110 is shown. The lead frame 116 is open to the atmosphere on one side so that a support tool can be used to stake pins 108 into place, and any solder joint made here can be readily inspected.

Referring to FIGS. 12-14, pins 108, of length about 0.3" and head, body and tail diameters of 0.072", 0.52" and 020", respectively, electrically contact lead frame 102 at shaded area 124. These pins are in turn connected to each other via lead frame 102 and capacitor 112, as shown in FIG. 15. FIGS. 13, 14 and 15 are sectional views through sections C—C, A—A and B—B of FIG. 12, respectively, and FIG. 14A is a view through section D—D of FIG. 14.

In FIG. 16, the precursor to lead frame 102 is shown. This lead frame is produced with a bridge 130 between regions 115 and 116. After molding the lead frame, this bridge is removed and capacitor 112 used to electrically connect the two regions. The lead frame 102 is made from copper alloy ½ hard, of thickness 0.015", plated with 0.0002" bright acid tin. It has length J of about 1"(the Figure is drawn to scale). Also provided in lead frame 115 are two openings 121 which aid in molding of lead frame 115.

Socket 100 is manufactured similarly to adaptor 10 above, by placing lead frame 102 in a mold such that holes 106 are formed at appropriate places. The plastic part is then removed from the mold, bridge 130 is next cut away and capacitor 112 soldered onto lead frame 102. Pins 108 are then pushed into holes 106 and 110. Pins 107, which may be knurled, are similarly pushed through remaining holes 106.

Multi-layer devices may also be produced by the above methods. Appropriately shaped lead frames are positioned over each other, electrically separated by a layer of Kapton TM and then sandwiched in a mold cavity to produce a molded multi lead frame. It is also possible to form three or more circuits in a plane by punching out a separating hole between adjacent circuits after molding.

For example, referring to FIGS. 17-17D, adaptor 200 has an array of three sets of pins 202 and their associated lead frames 204, 206, 208. These lead frames have at least one aperture 210, 212, 214, respectively, sized to press or force fit with a pin, such as pin 216, 218, 220. Other apertures 222 are provided in lead frames 206, 208 which are sized so that they will not allow contact of the lead frames with pins designed to contact other lead frames. The lead frames are encapsulated such that only conducting material of the lead frames around apertures 210, 212, 214 extends into apertures in the adaptor, and is thus available for contact with a pin 216, 218, 220. Leads 228, 230 having larger apertures are covered by the encapsulating material used to form the adaptor to insulate pins passing through the larger apertures from the surrounding conducting material. FIG. 17D is a sectional view through section A—A of FIG. 17B and shows a knurled portion of pin 220 locked to lead 230.

Connection of the above lead frames and pins with other computer hardware is facilitated by the provision of solder donuts. For example, the above described pins are provided with solder donuts 224, which fit over leads 226, 228, 230 of lead frames 204, 206, 208 and may seat in grooves 232. The leads 226, 228, 230 of lead frames are soldered to leads on printed circuit board 234 using solder donuts 224. The solder is melted by placing the whole adaptor and circuit board in an oven, after ends 226, 228, 230 are passed through mating openings in circuit board 234 and after solder preforms are placed in grooves 232. In an alternative form (FIG. 17C) the solder connections may be made on the upper surface 236 of circuit board 237. Solder donuts 224 may then be seated in grooves 232 before ends 226, 228, 230 are positioned over respective pads on the circuit board for surface mounting. Alternatively, the leads may be wave soldered. Preferably, stand off pegs 52 elevate adaptor 200 from circuit board 237.

Referring to FIGS. 18-20, various types of solder connections are shown. In FIG. 18, a solder donut 238 having a section 240 with smaller internal diameter than a second section 242 is shown. The smaller section 240 fits into a groove 244 in pin 246 as a downward force on pin 246 acts through shoulder 250. The lower face 248 below groove 244 is of smaller diameter than shoulder 250.

Referring to FIG. 18A, the use of the above solder donuts for soldering pins is demonstrated. Donut 238 (FIG. 18) is attached to pin 270 at groove 272. This assembly is then placed in an oven at a first temperature and the solder allowed to flow through aperture 280 along grooves (not shown) in pin 270, to electrically connect and seal pin 270 to adaptor 282. Then a second solder donut 274 is attached to the lower part of pin 276 below adaptor 278. The assembly is placed in an oven at a temperature that allows solder in donut 274 to flow but not the solder from donut 238, thereby connecting pin 276 and adaptor 278. Pin 270 and 276 are interconnected by placing male end 284 of pin 270 into female end 286 of pin 276. Pin 276 is provided with spring metal pieces 288 which prevent movement of end 284 from end 286. Solder does not flow onto male pin 284.

Referring to FIGS. 19 and 19A, pressing on solder donut 290 forms a lower ridge 292 after squeezing into a groove of pin 294 in LCC adaptor (PKG) 295 as described above. Pin 294 is then solder connected to lead frame 296 by melting solder donut 290 onto lead frame 296.

In other embodiments of the adaptor of this invention, a leadless chip carrier can also be electrically connected. For example, referring to FIGS. 20 and 20A, adaptor 300 is provided with a lead frame having leads 302. Leads 302 are connected to a leadless chip carrier (JEDEC B, C and D), having electrical termination points 304, by placing solder 305 in grooves 306 and causing it to melt.

In the molding process it is possible to mold not only around a lead frame but also around a lead frame having pins already inserted. Such a molding process requires a separate mold for each type of pin used but saves time and labor over later insertion of the pins. Any type of pin, however, can be used when only a lead frame alone is molded around.

Adaptors of this invention may also be formed by use of "lead pins" rather than lead frames. Lead pins provide individual elements of a lead frame and also provide an electrically connected pin. Thus, lead pins provide many of the advantages of a lead frame and in addition allow construction of adapters from molded plastic into which the pins and associated elements are later inserted. These molded plastic adaptors can be provided with offset bumps, and with bumps to prevent electrical contact between any two lead pins. Further, the adaptor molding can have any desired pattern of holes for pin insertion which may correspond to standard hole patterns, or may be any novel pattern required for any particular use. For example, gull wing devices may be connected to adaptors of this invention, formed from lead pins and molded plastic.

Referring to FIG. 21 an adaptor 310 for receiving a gull wing circuit is shown. Adaptor 310 includes a glass epoxy laminate 312 of thickness about 0.62" having an array of drilled or molded holes 314 approximately 0.018" diameter. Holes 314 are arranged so that leads 316, forming a lead foot print for receiving the circuit, are not overlapping. Molded ribs may be formed on laminate 312 to help keep leads 316 separated.

Referring to FIGS. 21A and 21B, a lead pin 318 used to form one of the leads 316 for adaptor 310 is shown. Lead pin 318 is press fitted to laminate 312 along a collar section 320. A shoulder section 322 serves as a stop. A step solder clad section 324 is bent in the direction indicated by arrow 326 to form lead 316 after lead pin 318 is inserted into laminate 312. Step portion 324 of the clad is used for holding a chip in place since it forms a resistive wall 327 for abutting a terminal of the chip. An alternate step solder clad section 325 is shown in FIG. 21D. This type of solder clad is used as an end lead for each side of laminate 312. Leads 316 may be glued with Kapton=or epoxy to laminate 312 if necessary. Lead pins may be manufactured by stamp or etch processes.

Referring to FIG. 21C, in another embodiment step solder clad 324 is fabricated with a hook end 328.

Each side of laminate 312 has three rows of lead pins 318. These rows are labeled $R_1$, $R_2$, and $R_3$ along one side of laminate 312. Lead pins 318 pressed in middle row $R_2$ is preferably pre bent to form an elbow 317 before being inserted into laminate 312 so that rows of lead pins 318 extending from laminate 312 are equally spaced approximately 0.100" as shown in FIG. 21B. Preferably, lead pins 318 extend 0.160" below laminate 312.

Referring to FIGS. 22–22D in an alternate embodiment, lead pins 330 are shown for insertion into off-set rows of holes 331 formed in a glass epoxy laminate 332. Lead pins 330 include a flat solder clad 334 which when inserted through holes 331 are bent in a direction indicated by arrows 336. Epoxy or Kapton TM may be used to glue clads 334 to laminate 332. Fishhooks 338 formed below clads 334 are friction fitted to laminate 332 when inserted into hole 331 (FIG. 22B). Lead pins 330 along one row of holes 331 have a shoulder stop 340 which displaces the terminals of pin 330 so that it compensates for the off-set of holes 331 and aligns the terminals of pins in an adjacent row.

Referring to FIGS. 23–23C, in order to aid in soldering a gull wing chip 420 to an adaptor 422 a spider device 424 is used. Gull-wing chip 420 has connector leads 426 which are to be soldered to leads 428 of lead frame 430. Adapter 422 is provided with ridges 432 between each lead 428 to prevent shorting of the leads. Between spider 424 and connector leads 426 is placed a sheet of Kapton TM 433 which prevents direct contact of metal spring spider legs 434 and leads 426. This sheet may be replaced by a piece of Kapton TM 436 or other suitable insulator, such as epoxy glue, attached directly to the ends of each spider leg 434, as shown in FIG. 23A. Each connector lead 426 has a piece of Kapton TM placed above it, and then a spider leg is contacted with this Kapton TM. The spider device 424 is constructed of a springy material such as stainless steel so that pressure on its upper surface 440 is transferred to legs 434 to exert pressure directly downward onto leads 426 at their ends 442, as shown by arrow 444. In this way leads 426 do not splay out of contact with lead frame 430, or move to touch adjacent leads. Thus, this spider device 424 assures contact of gull wing leads with conductors in the lead frame. The Kapton TM may be replaced by insulating paint sprayed, screened, or dipped onto the ends of spider legs 434.

Referring to FIG. 24, spider leg 448, which is used to hold spider device 424 in place on a PC board (not shown), is bifurcated along its length. Upper hooks 450 and lower hooks 452, separated by a neck section 453 having a length equal to the thickness of the PC board formed along the sides of leg 448. When leg 448 is inserted into a hole of the PC board, lower hooks 452 are compressed toward each other and may be clipped to the bottom side of the board. To release spider device 424 from the PC board upper hooks 450 are compressed together, thereby releasing lower hooks 452. Spider device 454 is reinforced by a channel 454 along the perimeter of the device.

Another example of an adaptor formed from lead pins and a molded plastic is shown in FIGS. 25 and 25A, which show top and bottom views of a surface mount adaptor socket 500. The adaptor socket 500 includes lead pins 502, which are mounted to a molded plastic insulator board. Lead pins 502 are mounted along three rows on each side of socket 500. The rows are staggered so that each terminal lead 504 of lead pin 502 remains electrically insulated from adjacent leads (as shown in FIG. 25A). Bridges of insulating material (not shown) may be molded between lead pins 502 to preserve electrical independence of each lead pin.

Referring to FIGS. 25B–25D, hooks 506 of lead pin 502 are friction fitted to holes 510 in insulator 512. Lead pin 502 may be fabricated by standard stamping or etching processes. The holes may be drilled or molded during the fabrication of insulator 502. A solder clad section 514 of lead pin 502 having a hole 516 is bent to align with an adjacent hole 518 in insulator 512 (FIG. 25D). Hole 516 of clad section 514 is held in place by press fitting a contact pin 520 through holes 516 and 518 as indicated by arrow 522 in FIG. 25D. Preferably contact pin 520 is gold plated to enhance electrical contact. Contact pin 520 has finger members 521 which serve to grip a male terminal member (not shown). Preferably hole 516 has a molded bump 523 at its bottom. This bump 523 causes fingers 521 to open slightly when contact pin 520 is inserted. Opening fingers 521 allows the male member to be pushed deeper into contact pin 520 with less force. With lead pin 502 securely mounted to insulator 512 terminal lead 504 is bent toward the outside perimeter of insulator 512 as indicated by arrow 524.

Referring to FIG. 25E an example is shown of a gull wing chip 524 attached to an adaptor 526. Adaptor 526 has terminal pins 528, which extend down from adaptor 526 and fit into contact pins 520. Terminal pins 528 may be soldered to contact pin 520. As a consequence, each terminal lead 504 is electrically connected to a terminal 530 of gull wing chip 524.

The adaptor described above has several advantages. The adaptor allows soldering of a PC board to a socket and then plugging a gull wing chip mounted to an adaptor to the socket. The footprint of the socket may be specially designed for the gull wing.

Referring to FIG. 26, in another embodiment, an adaptor 600 is provided with a heat sink 602 which extends past the area of pins 604 (having holes 606 to prevent electrical contact with the pins) and beyond a molded plastic perimeter 608, to provide an extended perimeter region 610 jutting about 1–2 mm beyond plastic perimeter 608. A metal lid 612 may be brazed or riveted, as desired, to heat sink 02. Alternatively, as shown in FIG. 26A metal lid 612 may have a hooked end 614 adapted to securely snap-fit to perimeter region 610 to provide an adaptor with a secure metal lid. Stand off bumps 616 prevent heat sink 602 from contacting a PC board. Silicone rubber gaskets 618, 620 are provided in regions between plastic 522, lid 612, and heat sink 602 and around areas surrounding a chip 624. These gaskets prevent moisture from reaching chip 624 and can be provided in any regions where access to external air is possible. Because lid 612 can be securely and tightly clamped about chip 624 by fastening to heat sink 602, this provides an adaptor suitable for use in military applications, or for sending to extraterrestrial environments. This adaptor has the added advantage of allowing increased heat dissipitation, since chip 624 is surrounded by a metal cocoon.

Referring to FIGS. 27, 28 and 29, there is shown another method for manufacture of a molded-in lead frame, and for providing secure and readily inspectable soldering attachment to a J-lead chip 628. Lead frame 630 is provided with extended leads 632 which are bent at about 90° to allow connection with a central part of a J-lead 634 using solder 636. As shown in FIG. 27A, solder 636 is applied as a strip running along the sides of chip 628. During heating solder 636 melts onto lead frame 630 and interconnects the leads with the chip.

Figure 4A:
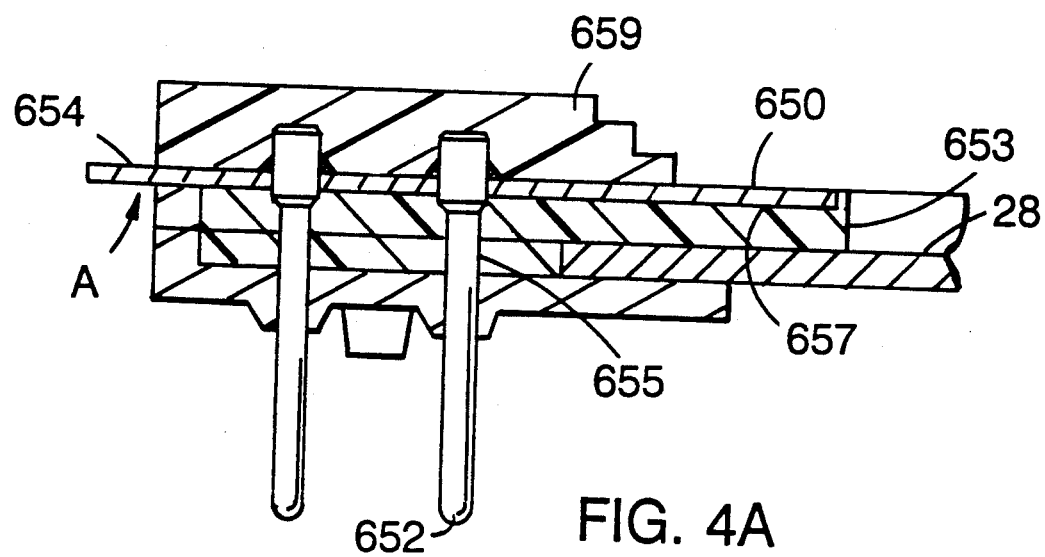
FIG. 4A is a sectional view through an alternative embodiment of an adaptor.

Referring to FIGS. 4A, 28 and 29, to manufacture ht adaptor shown in FIG. 4A and 27 it is preferred to provide a lead frame 650 with pins 652 soldered or press fitted in place prior to molding. A separate plastic mold 653 is provided with holes 655 and grooves 657 which allow lead frame 650, and associated pins 652, to be placed within the mold and each lead separated from adjacent leads by the plastic of the mold. Lead frame 650 is then glued to the mold, and window frame 654 cut off (shown by arrow A) to leave the leads within the mold. A second mold 659 is then made around first mold 653, leads and pins. If desired, as shown in FIG. 27, ends 656 of the leads (which were attached to window frame 654) are left extending out of the molds. A heat sink 28 is also molded into a suitable position. Ends 656 are then bent upward about 90° to allow a J-lead chip to be dropped into grooves 658 and soldered to ends 656.

We claim:

1. An adapter for connection of an integrated circuit package to a circuit board, the package being of the type having a plurality of solder leads which are soldered to the adapter after the package is placed on said adapter, said adapter comprising
   a plurality of pins for connection to the circuit boards,
   a plurality of lead frame elements, each said lead frame element being cut from the same lead frame and positioned relative to other said lead frame elements in the same general orientation as in the lead frame prior to being cut, each said pin being individually secured to a said lead frame element by soldering or press fitting, and each said lead frame element including a solder connection region sized and positioned for making a solder connection to one of a plurality of solder leads of an integrated circuit package, and
   insulative plastic molded around said pins and said lead frame elements to form a molded plastic body, the molded plastic body having a shape providing a plurality of grooves that each expose a connection region of one said lead frame element and that are adapted to serve in aligning the solder leads of the integrated circuit package with said connection regions, said grooves and connection regions sized and configured to accept solder and to allow inspection of a solder connection between a said solder lead and a said connection region.

2. The adapter of claim 1, wherein said connection regions each include ends bent upward about 90° to allow a J-lead device to be dropped into said grooves and soldered to said ends.

3. The adapter of claim 1, wherein said grooves are separated by walls sized and configured to prevent solder from spreading from one said lead frame element to the next.

4. The adapter of claim 1, wherein said grooves are sized and configured to accept the J-leads of a J-lead device and are separated by walls that prevent the J-leads from coming into contact with more than one lead frame element.

* * * * *

UNITED STATES PATENT AND TRADEMARK OFFICE
CERTIFICATE OF CORRECTION

PATENT NO. : 5,168,432

DATED : 12/1/92

INVENTOR(S) : James V. Murphy and Michael J. Murphy

It is certified that error appears in the above-identified patent and that said Letters Patent is hereby corrected as shown below:

On the title page:

Under [63] Related U.S. Application Data, delete the second occurrence of "abandoned".

Under [56] References Cited, U.S. PATENT DOCUMENTS, please amend the following reference:

Brown, U.S. Pat. No. 4,640,010, "2/1987" should be --3/87--.

Add the following references under U.S. PATENT DOCUMENTS:

| | | | |
|---|---|---|---|
| 4,378,139 | 3/83 | Griffin et al. | 339/75 |
| 4,381,131 | 4/83 | Demnianiuk | 339/75 |
| 4,504,105 | 3/85 | Barkus et al. | 339/75 |
| 4,560,216 | 12/85 | Egawa | 339/12 |
| 4,598,965 | 7/86 | Bricaud et al. | 339/75 |
| 4,614,387 | 9/86 | Hartl | 339/17 |
| 4,677,526 | 6/87 | Muehling | 361/386 |

UNITED STATES PATENT AND TRADEMARK OFFICE
CERTIFICATE OF CORRECTION

PATENT NO.  : 5,168,432

DATED       : 12/1/92

INVENTOR(S) : James V. Murphy and Michael J. Murphy

It is certified that error appears in the above-identified patent and that said Letters Patent is hereby corrected as shown below:

Add the following publications under OTHER PUBLICATIONS:

Circle EE 9 "Molded Thermoplastic PGA Package" (Advertisement)

Electronics, "How to Make Pin-Grid Arrays at Half The Cost" (2/1987)

AMP, "Premolded Plastic Chip Carrier" (Advertisement)

Autosplice Advertisement, Electronics Packaging & Production

Werther, "Molded Thermoplastics for Pin-Grid Array Chip Packaging", Photocircuits (5/1986)

Tricon Industries Advertisement

Plasticorp, "3D Circuit Boards", Advertisement

Exhibit A

Circuits Plus, "Three-dimensional and multilayer molded circuit design", Advertisement Raychem, "SolderQuik Tape", Advertisement AMP Advertisement

UNITED STATES PATENT AND TRADEMARK OFFICE
CERTIFICATE OF CORRECTION

PATENT NO. : 5,168,432

DATED : 12/1/92

INVENTOR(S) : James V. Murphy and Michael J. Murphy

It is certified that error appears in the above-identified patent and that said Letters Patent is hereby corrected as shown below:

PEM, "Miniature Self-Clinching Fasteners", Bulletin FE-981

Advanced Interconnections, "Solder Preform Sockets", Advertisement

Murphy, "Sub-Surface Mount Decoupling Capacitor Sockets with New Molded in Circuit", Advanced Interconnections Corp., pp. 595-597

Kammerer (German advertisement, date unknown)

Col. 1, line 10, delete ", now abandoned" and insert --.--.

Col. 1, line 26, "J lead" should be --J-lead--.

Col. 1, line 41, "4,379,139" should be --4,378,139--.

Col. 1, line 41, "4,614,384" should be --4,614,387--.

Col. 2, line 39, "solder accepting" should be --solder-accepting--.

Col. 2, line 66, "gull wing" should be --gull-wing--.

Col. 3, lines 29-30, "reel to reel" should be --reel-to-reel--.

UNITED STATES PATENT AND TRADEMARK OFFICE
CERTIFICATE OF CORRECTION

PATENT NO. : 5,168,432

DATED : 12/1/92

INVENTOR(S) : James V. Murphy and Michael J. Murphy

It is certified that error appears in the above-identified patent and that said Letters Patent is hereby corrected as shown below:

Col. 3, line 47, "multi layer" should be --multi-layer--.

Col. 4, line 24, "cut away" should be --cut-away--.

Col. 5, line 38, "gull wing" should be --gull-wing--.

Col. 5, line 44, "cut away" should be --cut-away--.

Col. 5, line 45, "gull wing" should be --gull-wing--.

Col. 5, line 46, "gull wing" should be --gull-wing--.

Col. 5, line 49, "gull wing" should be --gull-wing--.

Col. 5, line 56, "cut away" should be --cut-away--.

Col. 6, line 2, "J lead" should be --J-lead--.

Col. 6, line 62, "Kapton⊥" should be --Kapton™--.

Col. 7, line 1, "Kapton⊥" should be --Kapton™--.

Col. 7, line 2, "Kapton⊥" should be --Kapton™--.

Col. 8, line 25, "2" should be --28--.

UNITED STATES PATENT AND TRADEMARK OFFICE
CERTIFICATE OF CORRECTION

PATENT NO.   : 5,168,432

DATED        : 12/1/92

INVENTOR(S)  : James V. Murphy and Michael J. Murphy

It is certified that error appears in the above-identified patent and that said Letters Patent is hereby corrected as shown below:

Col. 9, line 17, each occurrence of "J lead" should be --J-lead--.

Col. 9, line 21, "J leads" should be --J-leads--.

Col. 9, line 45, "soldered in" should be --soldered-in--.

Col. 9, line 45, "off center" should be --off-center--.

Col. 10, line 18, "multi lead" should be --multi-lead--.

Col. 10, line 44, "above described" should be --above-described--.

Col. 10, line 59, "stand off" should be --stand-off--.

Col. 11, line 20, "solder connected" should be --solder-connected--.

Column 12, line 6, "Kapton=" should be --Kapton™--

Col. 12, line 14, "pre bent" should be --pre-bent--.

Col. 12, line 34, "gull wing" should be --gull-wing--.

UNITED STATES PATENT AND TRADEMARK OFFICE
CERTIFICATE OF CORRECTION

PATENT NO.   : 5,168,432

DATED        : 12/1/92

INVENTOR(S)  : James V. Murphy and Michael J. Murphy

It is certified that error appears in the above-identified patent and that said Letters Patent is hereby corrected as shown below:

Col. 12, line 54, "gull wing" should be --gull-wing--.

Col. 14, line 11, "ht" should be --the--.

Signed and Sealed this

Thirtieth Day of November, 1993

Attest:

BRUCE LEHMAN

*Attesting Officer*    Commissioner of Patents and Trademarks